(12) United States Patent
Xia et al.

(10) Patent No.: US 10,229,993 B2
(45) Date of Patent: Mar. 12, 2019

(54) LDMOS TRANSISTORS INCLUDING RESURF LAYERS AND STEPPED-GATES, AND ASSOCIATED SYSTEMS AND METHODS

(71) Applicant: Maxim Integrated Products, Inc., San Jose, CA (US)

(72) Inventors: John Xia, Fremont, CA (US); Marco A. Zungia, Berkeley, CA (US); Badredin Fatemizadeh, Palo Alto, CA (US)

(73) Assignee: Maxin Integrated Products, Inc., San Jose, CA (US)

( * ) Notice: Subject to any disclaimer, the term of this patent is extended or adjusted under 35 U.S.C. 154(b) by 0 days.

(21) Appl. No.: 15/456,930

(22) Filed: Mar. 13, 2017

(65) Prior Publication Data

US 2017/0263766 A1   Sep. 14, 2017

Related U.S. Application Data

(60) Provisional application No. 62/307,862, filed on Mar. 14, 2016.

(51) Int. Cl.
*H01L 29/78* (2006.01)
*H01L 21/311* (2006.01)
(Continued)

(52) U.S. Cl.
CPC .... *H01L 29/7823* (2013.01); *H01L 21/31111* (2013.01); *H01L 21/32133* (2013.01);
(Continued)

(58) Field of Classification Search
CPC ......... H01L 29/7823; H01L 21/823814; H01L 29/4238; H01L 29/66681; H01L 21/31111; H01L 29/42368; H01L 21/32133; H01L 21/823807; H01L 29/1095; H01L 21/82385; H01L 21/823857;
(Continued)

(56) References Cited

U.S. PATENT DOCUMENTS 6,979,875 B2   12/2005   Kwon et al.
7,888,222 B2   2/2011   You et al.
(Continued)

*Primary Examiner* — Jung Kim
(74) *Attorney, Agent, or Firm* — Lathrop Gage LLP

(57) ABSTRACT

A lateral double-diffused metal-oxide-semiconductor field effect (LDMOS) transistor includes a silicon semiconductor structure including (a) a base layer, (b) a p-type reduced surface field effect (RESURF) layer disposed over the base layer in a thickness direction, (c) a p-body disposed over the p-type RESURF layer in the thickness direction, (d) a source p+ region and a source n+ region each disposed in the p-body, (e) a high-voltage n-type laterally-diffused drain (HVNLDD) disposed adjacent to the p-body in a lateral direction orthogonal to the thickness direction, the HVN-LDD contacting the p-type RESURF layer, and (f) a drain n+ region disposed in the HVNLDD. The LDMOS transistor further includes (a) a first dielectric layer disposed on the silicon semiconductor structure in the thickness direction over at least part of the p-body and the HVNLDD and (b) a first gate conductor disposed on the first dielectric layer in the thickness direction.

17 Claims, 25 Drawing Sheets

(51) Int. Cl.

| | | |
|---|---|---|
| *H01L 21/3213* | (2006.01) | |
| *H01L 21/8238* | (2006.01) | |
| *H01L 27/092* | (2006.01) | |
| *H01L 29/06* | (2006.01) | |
| *H01L 29/08* | (2006.01) | |
| *H01L 29/423* | (2006.01) | |
| *H01L 29/66* | (2006.01) | |
| *H03K 17/687* | (2006.01) | |
| *H01L 29/40* | (2006.01) | |
| *H01L 29/10* | (2006.01) | |

(52) U.S. Cl.
CPC ......... *H01L 21/82385* (2013.01); *H01L 21/823807* (2013.01); *H01L 21/823814* (2013.01); *H01L 21/823857* (2013.01); *H01L 27/0922* (2013.01); *H01L 29/063* (2013.01); *H01L 29/0865* (2013.01); *H01L 29/0878* (2013.01); *H01L 29/0882* (2013.01); *H01L 29/0886* (2013.01); *H01L 29/402* (2013.01); *H01L 29/4238* (2013.01); *H01L 29/42368* (2013.01); *H01L 29/42376* (2013.01); *H01L 29/66681* (2013.01); *H01L 29/7816* (2013.01); *H03K 17/687* (2013.01); *H01L 21/823892* (2013.01); *H01L 29/0653* (2013.01); *H01L 29/0696* (2013.01); *H01L 29/1095* (2013.01); *H01L 29/7831* (2013.01)

(58) Field of Classification Search
CPC ......... H01L 21/823892; H01L 27/0922; H01L 29/063; H01L 29/08; H01L 29/0882; H01L 29/0886; H01L 29/42376; H03K 17/687

See application file for complete search history.

(56) References Cited

U.S. PATENT DOCUMENTS

| | | |
|---|---|---|
| 8,278,710 B2 | 10/2012 | Khemka et al. |
| 8,354,717 B2 | 1/2013 | You et al. |
| 8,431,450 B1 | 4/2013 | Zuniga et al. |
| 8,541,862 B2 * | 9/2013 | Yang ............ H01L 21/761 257/492 |
| 8,936,980 B1 | 1/2015 | Zuniga et al. |
| 9,397,211 B2 | 7/2016 | Denison et al. |
| 2012/0104492 A1 | 5/2012 | Chu et al. |
| 2013/0313639 A1 | 11/2013 | Shiraj |

\* cited by examiner

US 10,229,993 B2

LDMOS TRANSISTORS INCLUDING RESURF LAYERS AND STEPPED-GATES, AND ASSOCIATED SYSTEMS AND METHODS

RELATED APPLICATIONS

This application claims benefit of priority to United States Provisional Patent Application Ser. No. 62/307,862, filed Mar. 14, 2016, which is incorporated herein by reference.

BACKGROUND

Metal-oxide-semiconductor field effect transistors, often referred to as MOSFETS, are widely used in electronic devices, such as for switching or amplification. MOSFETS are capable of achieving fast switching speeds, which makes them well suited for high-frequency applications. Additionally, MOSFETS are relatively simple to control because they are voltage-controlled, not current-controlled.

Lateral double-diffused metal-oxide-semiconductor field effect transistors, often referred to as LDMOS transistors, are a class of MOSFETS where drain-to-source voltage is blocked within the transistors' semiconductor material primarily in a lateral direction. LDMOS transistors are often combined with other circuitry in integrated circuits, especially in power and radio-frequency applications.

FIG. 1 is a cross-sectional view of a prior art n-channel LDMOS transistor 100 including a silicon semiconductor structure 102, a source electrode 104, a gate structure 106, and a drain electrode 108. Source electrode 104 is stacked on a top surface 110 of silicon semiconductor structure 102 in a source region 112 of LDMOS transistor 100, and drain electrode 108 is stacked on top surface 110 in a drain region 114 of LDMOS transistor 100. Gate structure 106 includes a gate electrode 116, a polysilicon layer 117, and a silicon dioxide layer 118 stacked in a gate region 120 of LDMOS transistor 100. Silicon semiconductor structure 102 includes a p-type substrate 122, an n-well 124, a p-body 126, a source p+ region 128, a source n+ region 130, and a drain n+ region 132. N-well 124 is formed over p-type substrate 122, and p-body 126 is formed in n-well 124 under source electrode 104. Drain n+ region 132 is formed in n-well 124 and contacts drain electrode 108. Each of source p+ region 128 and source n+ region 130 is formed in p-body 126 and contacts source electrode 104. Each of source n+ region 130 and drain n+ region 132 is more heavily doped than n-well 124, and source p+ region 128 is more heavily doped than p-body 126.

When positive voltage $V_{DS}$ is applied across drain electrode 108 and source electrode 104, a p-n junction at the interface of n-well 124 and p-body 126 is reversed biased. Consequentially, essentially no current flows from drain electrode 108 to source electrode 104 by default. The relative dopant concentration of drain n+ region 132 and n-well 124 causes a portion of n-well 124—referred to as a drift region 134—to carry the majority of voltage $V_{DS}$, thereby enabling LDMOS transistor 100 to support a relatively large value of $V_{DS}$ without breakdown.

A positive voltage $V_{GS}$ applied between gate electrode 116 and source electrode 104 creates negative charges in silicon semiconductor structure 102 under silicon dioxide layer 118, causing a minority-carrier channel to form in a region 136 of p-body 126. The minority-carrier channel has excess electrons and will therefore conduct electric current. Consequentially, current will flow in a lateral direction 138 through silicon semiconductor structure 102, from drain n+ region 132 to source n+ region 130, when $V_{GS}$ exceeds a threshold value and $V_{DS}$ is a positive value. The current can encounter substantial resistance, however, in drift region 134 due to relatively light n-type dopant concentration in n-well 124.

DETAILED DESCRIPTION OF THE EMBODIMENTS

Applicant has developed LDMOS transistors and associated systems and methods which significantly advance the state of the art. Certain embodiments include at least one reduced surface field effect (RESURF) layer and a stepped-gate structure to promote low on-resistance and high breakdown voltage, as well as small pitch between adjacent LDMOS transistors. Additionally, some embodiments include a split-gate structure to further promote high transistor performance.

Figure 1:
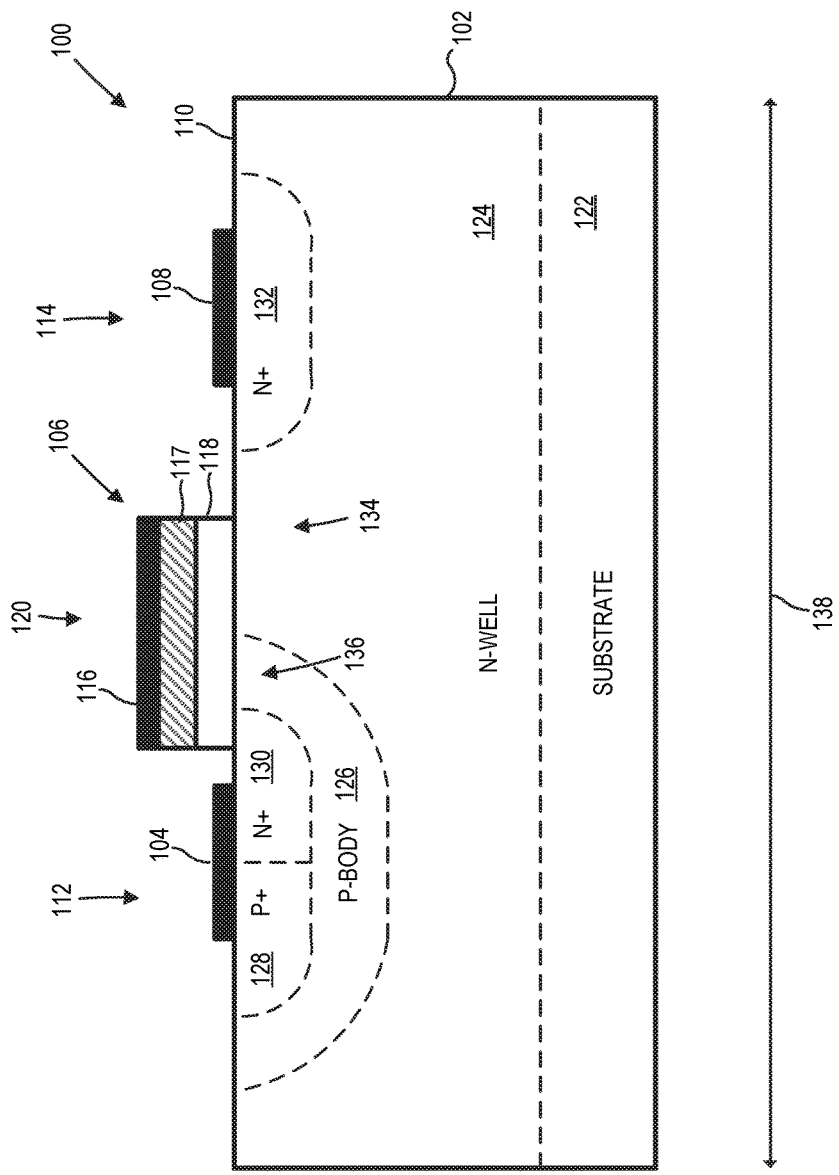
FIG. 1 is a cross-sectional view of a prior-art LDMOS transistor.
Figure 2:
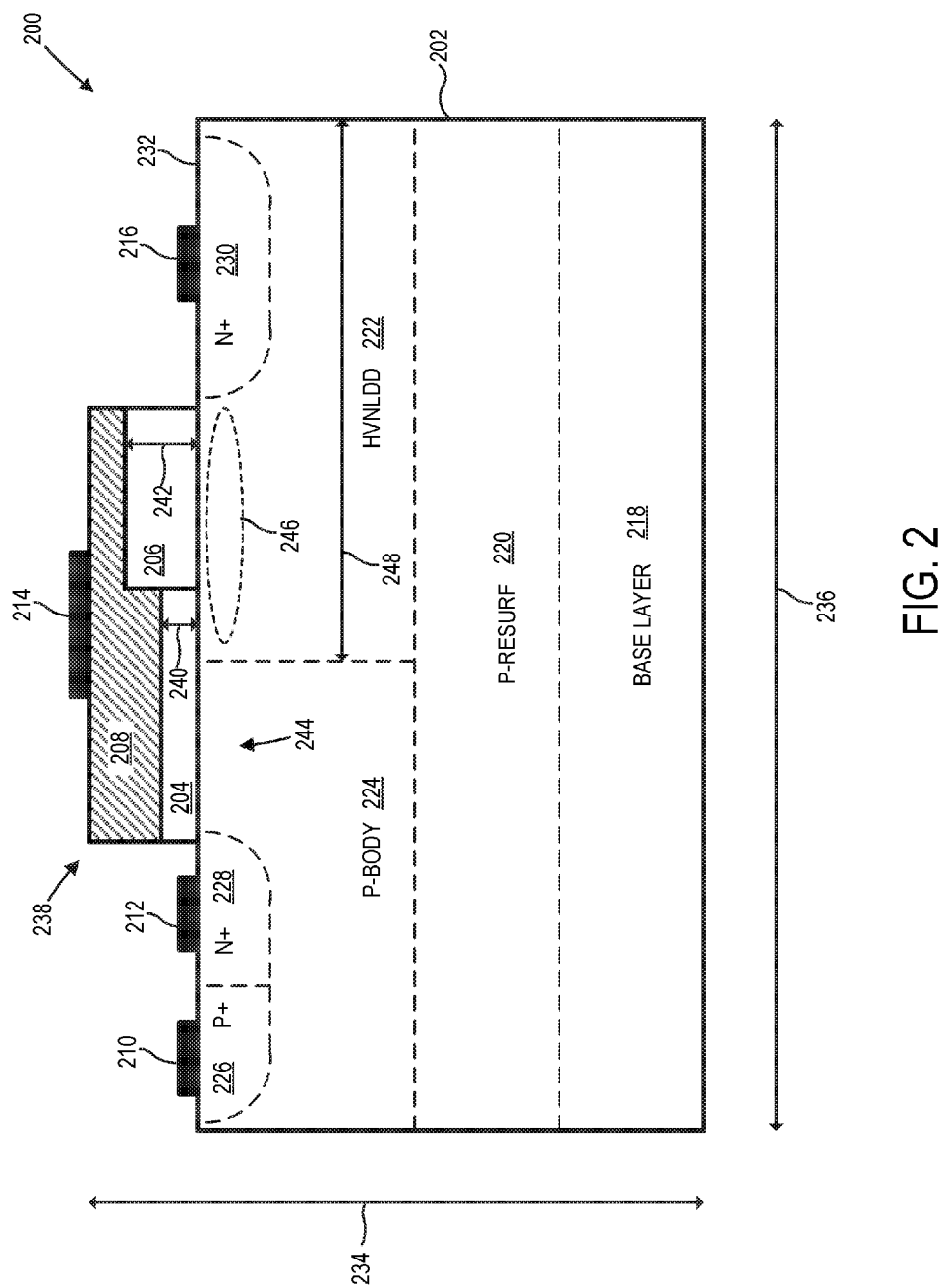
FIG. 2 is a cross-sectional view of a LDMOS transistor including a p-type reduced surface field effect (RESURF) layer and a stepped-gate structure, according to an embodiment.
Figure 3:
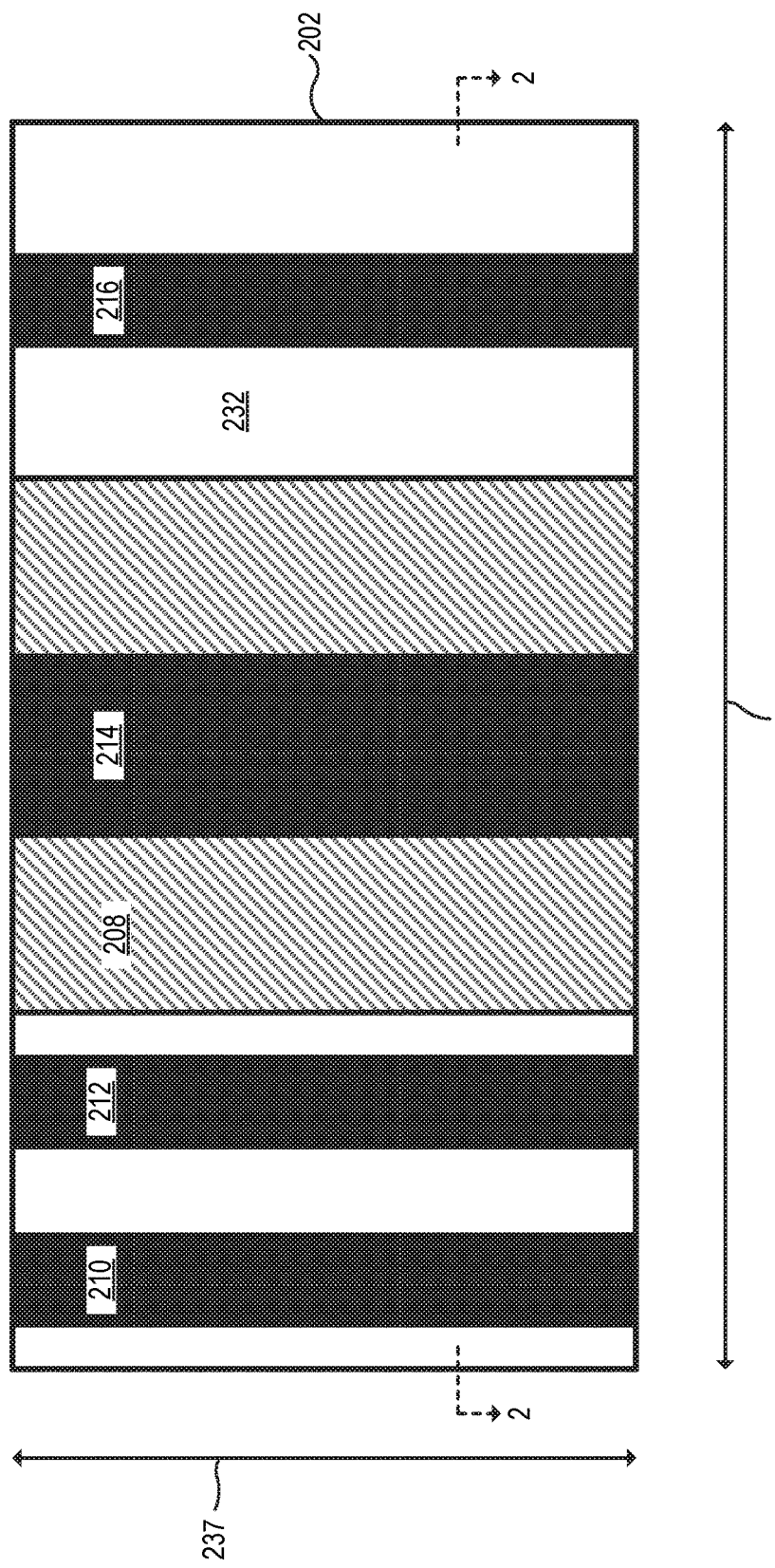
FIG. 3 is a top plan view of the FIG. 2 LDMOS transistor.

FIG. 2 is a cross-sectional view of a LDMOS transistor 200 including a p-type RESURF layer and a stepped-gate structure. FIG. 3 is a top plan view of LDMOS transistor 200. The cross-section of FIG. 2 is taken along line 2-2 of FIG. 3.

LDMOS transistor 200 includes a silicon semiconductor structure 202, a first dielectric layer 204, a second dielectric layer 206, a first gate conductor 208, a body electrode 210, a source electrode 212, a first gate electrode 214, and a drain electrode 216. Silicon semiconductor structure 202 includes a base layer 218, a p-type RESURF layer 220, a high-voltage n-type laterally-diffused drain (HVNLDD) 222, a p-body 224, a source p+ region 226, a source n+ region 228, and a drain n+ region 230. Source p+ region 226 has a greater p-type dopant concentration than p-body 224, and p-body 224 has a greater p-type dopant concentration than p-type RESURF layer 220. Each of source n+ region 228 and drain n+ region 230 has a greater n-type dopant concentration than HVNLDD 222. One or more regions of silicon semiconductor structure 202 optionally have graded dopant concentrations. For example, in a particular embodiment, p-body 224 has a graded concentration of p-type dopant, where p-type dopant concentration is greatest near a first outer surface 232 of silicon semiconductor structure 202. Silicon semiconductor structure 202 can include additional impurity regions without departing from the scope hereof. Base layer 218 is, for example, a p-type silicon substrate or an n-type high-voltage well in a silicon substrate.

P-type RESURF layer 220 is disposed over base layer 218 in a thickness direction 234. P-body 224 is disposed over p-type RESURF layer 220 in the thickness direction 234, and each of source p+ region 226 and source n+ region 228 is disposed in p-body 224 adjacent to first outer surface 232 of silicon semiconductor structure 202. Source p+ region 226 and source n+ region 228 are adjacent to each other in a lateral direction 236. Each of the lateral direction 236, the thickness direction 234, and a depth direction 237 are orthogonal to each other. HVNLDD 222 is disposed adjacent to p-body 224 in the lateral direction 236, and HVNLDD 222 contacts p-type RESURF layer 220. Drain n+ region 230 is disposed in HVNLDD 222 adjacent to first outer surface 232. HVNLDD 222 and p-type RESURF layer 220 collectively achieve a reduced surface field effect to promote low on-resistance and high breakdown voltage, as discussed below. In some embodiments, p-type RESURF layer 220 and HVNLDD 222 are electrically isolated from base layer 218, such as to allow for reverse-voltage operation where source n+ region 228 is positively biased with respect to drain n+ region 230.

First dielectric layer 204 is disposed on first outer surface 232 over a portion of each of p-body 224 and HVNLDD 222 in the thickness direction 234. Similarly, second dielectric layer 206 is disposed on first outer surface 232 over a portion of HVNLDD 222 in the thickness direction 234. First gate conductor 208 is disposed on each of first dielectric layer 204 and second dielectric layer 206 in the thickness 234 direction. First dielectric layer 204, second dielectric layer 206, and first gate conductor 208 collectively form a gate structure 238. First dielectric layer 204 has a first thickness 240, and second dielectric layer 206 has a second thickness 242, where second thickness 242 is greater than first thickness 240, such that gate structure 238 is a stepped-gate structure.

Body electrode 210 contacts source p+ region 226 to provide electrical interface to source p+ region 226, and source electrode 212 contacts source n+ region 228 to provide electrical interface to source n+ region 228. Body electrode 210 and source electrode 212 are typically electrically coupled together by an electrical conductor (not shown), to prevent turn-on of a parasitic bipolar junction transistor (BJT) (not shown) within silicon semiconductor structure 202. Such electrical coupling of body electrode 210 and source electrode 212 is not required, however. Additionally, in some embodiments, such as discussed below with respect to FIG. 9, body electrode 210 and source electrode 212 are implemented by a common conductive structure. First gate electrode 214 contacts first gate conductor 208 to provide electrical access to stepped-gate structure 238, and drain electrode 216 contacts drain n+ region 230 to provide electrical access to drain n+ region 230. Although each of body electrode 210, source electrode 212, first gate electrode 214, and drain electrode 216 are each illustrated in FIG. 3 as being a single element, in some other embodiments, one or more of these electrodes are formed of two or more elements. In some embodiments, first dielectric layer 204 and second dielectric layer 206 are each formed of silicon dioxide or a high-K dielectric material, and first gate conductor 208 is formed of polysilicon.

When a positive voltage $V_{DS}$ is applied across drain electrode 216 and source electrode 212, a p-n junction formed at the interface of HVNLDD 222 and p-body 224 is reversed biased, so that very little current flows between drain electrode 216 and source electrode 212 by default. However, a positive voltage $V_{GS}$ applied between first gate electrode 214 and source electrode 212 creates negative charges in silicon semiconductor structure 202 under first dielectric layer 204 and second dielectric layer 206, causing a minority-carrier channel to form in a region 244 of p-body 224. The channel has excess electrons and therefore conducts electric current through p-body 224. Consequentially, current will flow through silicon semiconductor structure 202 from drain n+ region 230 to source n+ region 228 when $V_{GS}$ exceeds a threshold value $V_{th}$ and $V_{DS}$ is a positive value. Threshold value $V_{th}$ is established, in part, by dopant concentration in p-body 224 and by first thickness 240 of dielectric layer 204. Threshold voltage $V_{th}$ may be reduced during the design of LDMOS transistor 200, for example, by decreasing dopant concentration in p-body 224 adjacent to first dielectric layer 204, or by decreasing first thickness 240.

HVNLDD 222 and p-type RESURF layer 220 collectively achieve a reduced surface field effect, where electric field distribution along HVNLDD 222 is more uniform than an electric field distribution which would result if p-type RESURF layer 220 were not present. To help understand this principle, consider an alternate embodiment of LDMOS transistor 200 where p-type RESURF layer 220 is omitted. Forward biasing drain electrode 216 with respect to source electrode 212 will create a depletion region in HVNLDD 222 from the vertical p-n junction of p-body 224 and HVNLDD 222. This depletion region will extend only partly into HVNLDD 222 in the lateral direction 236, resulting in a sharp electric field gradient within HVNLDD 222. As a result, breakdown voltage is heavily dependent on n-type dopant concentration in HVNLDD 222.

Now consider LDMOS transistor 200 with p-type RESURF layer 220 present. A second (horizontal) p-n junction is formed at the interface of HVNLDD 222 and p-type RESURF layer 220. Thus, forward biasing drain electrode 216 with respect to source electrode 212 creates two depletion regions within HVNLDD 222, i.e., a first depletion region associated with the vertical p-n junction and a second depletion region associated the horizontal p-n junction. These two depletion regions will occupy the entirety of HVNLDD 222 if HVNLDD 222 is sufficiently thin in the thickness direction 234, thereby causing electric field distribution within HVNLDD 222 to be relatively uniform. Consequentially, breakdown voltage is relatively insensitive to dopant concentration in HVNLDD 222, and n-type doping concentration in HVNLDD 222 can therefore be relatively high to promote low resistance of HVNLDD 222, without degrading breakdown voltage of LDMOS transistor 200.

Stepped-gate structure 238 also promotes low on-resistance and high breakdown voltage of LDMOS transistor 200. In particular, that stepped-gate structure 238 extends over HVNLDD 222 causes electrons to collect in a portion of HVNLDD adjacent to stepped-gate structure 238 when $V_{GS}$ is positive, thereby creating a low-resistance majority-carrier channel in HVNLDD 222. Additionally, the relatively large second thickness 242 of second dielectric layer 206 promotes high breakdown voltage of LDMOS transistor 200, without significantly affecting threshold voltage $V_{th}$ of LDMOS transistor 200.

Silicon semiconductor structure 202 optionally further includes an n-type reduced surface field effect (RESURF) layer 246 disposed below each of first dielectric layer 204 and second dielectric layer 206 in the thickness direction 234. N-type RESURF layer 246 has an n-type dopant concentration different from that of HVNLDD 222 to further promote majority carrier conductivity under stepped-gate structure 238. The outline of n-type RESURF layer 246 in FIG. 2 is approximate, and in some embodiments, n-type RESURF layer 246 extends into p-body 224.

It should be appreciated that inclusion of p-type RESURF layer 220, stepped-gate structure 238, and n-type RESURF layer 246 in LDMOS transistor 200 does not necessarily cause LDMOS transistor 200 to have a larger footprint that it would have without these features. Accordingly, the configuration of LDMOS transistor 200 advantageously promotes small device pitch, along with low on-resistance and high breakdown voltage.

Silicon semiconductor structure 202 is formed, for example, by implanting impurities into a silicon wafer, by epitaxially forming one or more layers on a silicon wafer, or by a combination of these two techniques. For example, in embodiments where base layer 218 is an n-type high voltage well, base layer 218 may be formed by implanting n-type impurities into a silicon wafer or by epitaxially forming base layer 218 on a substrate. As another example, each of p-type RESURF layer 220 and n-type RESURF layer 246 may be formed by implanting impurities into silicon semiconductor structure 202 using a common mask, before forming second gate dielectric layer 206.

Figure 4:
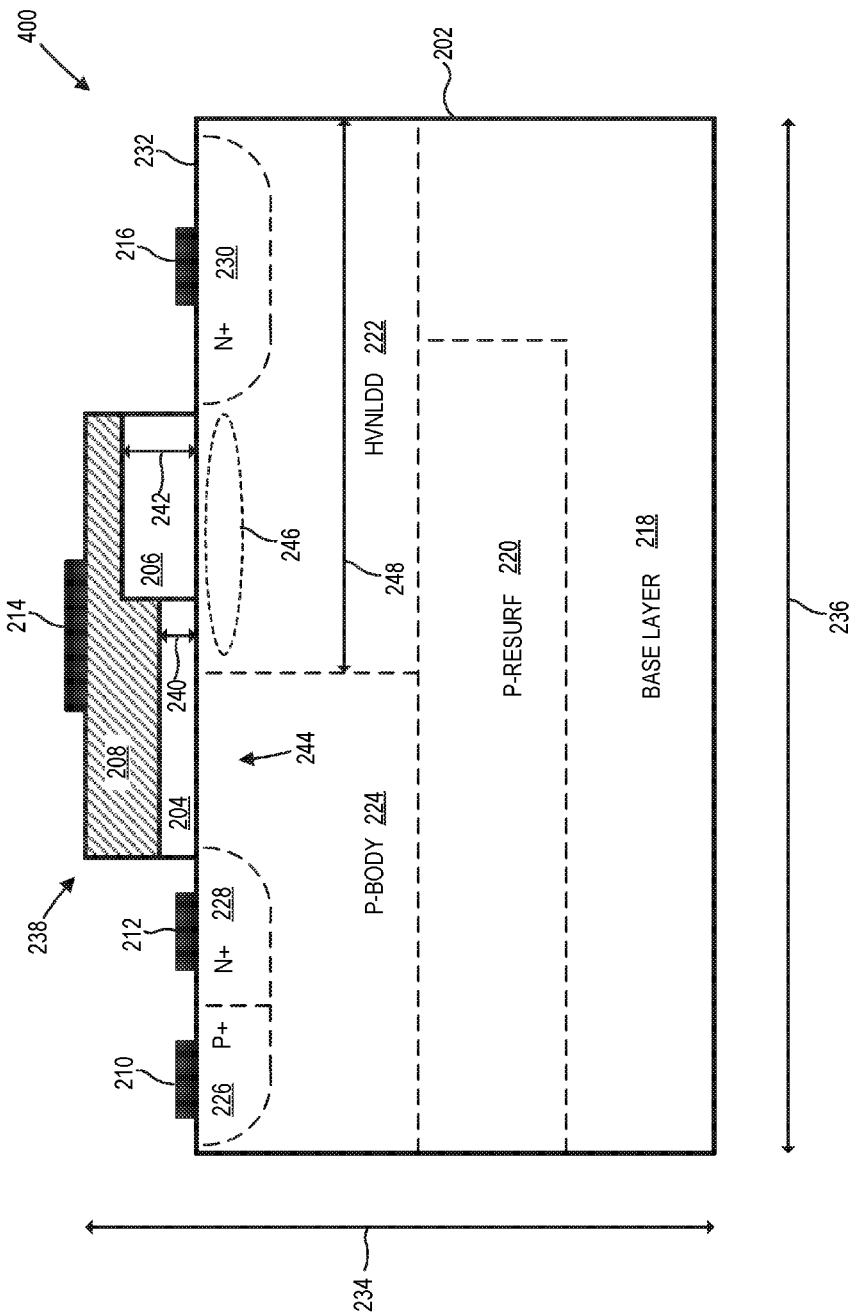
FIG. 4 is cross-sectional view of a LDMOS transistor like that of FIG. 2, but where the p-type RESURF layer extends along only a portion of a p-body's length, according to an embodiment.

In some cases it may not be necessary for p-type RESURF layer 220 to extend along an entire length 248 of p-body 224 in the lateral direction 236 to achieve a reduced surface field effect. Consequentially, in certain embodiments, p-type RESURF layer 220 extends along only a portion of length 248. For example, FIG. 4 is cross-sectional view of a LDMOS transistor 400, which is like LDMOS transistor 200 of FIG. 2, but where p-type RESURF layer 220 only extends along a portion of length 248 of p-body 224.

Figure 5:
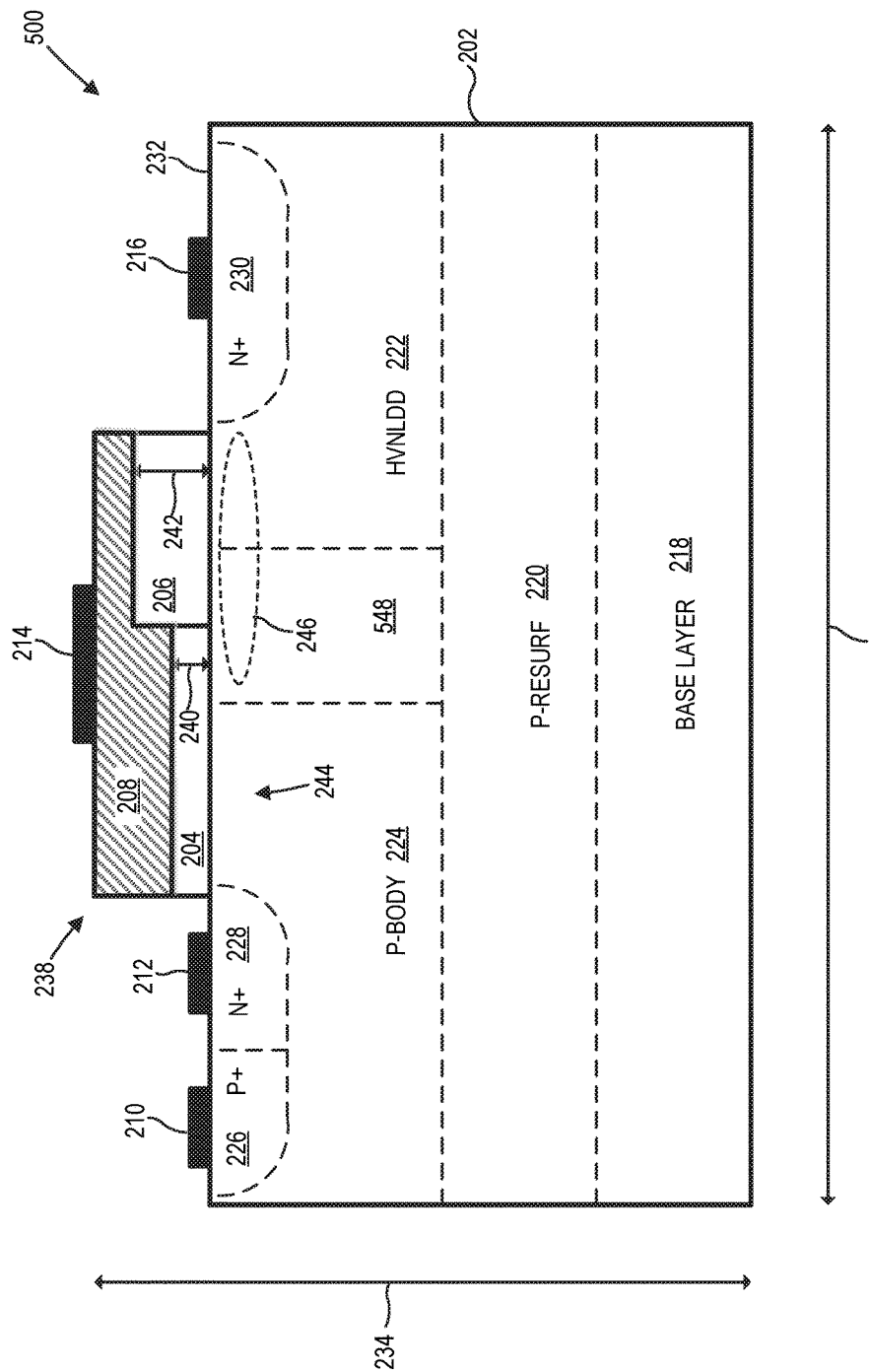
FIG. 5 is a cross-sectional view of a LDMOS transistor similar to that of FIG. 2, but where a high-voltage laterally-diffused drain is separated from a p-body by an n-type high-voltage well, according to an embodiment.

Furthermore, in some embodiments HVNLDD 222 does not contact p-body 224 but is instead laterally separated 236 from p-body 224 by a region of silicon semiconductor substrate 202 having a lower n-type dopant concentration than HVNLDD 222. For example, FIG. 5 is a cross-sectional view of a LDMOS transistor 500 similar to LDMOS transistor 200 of FIG. 2, but where HVNLDD 222 is separated from p-body 224 by an n-type high-voltage well 548. Optional n-type RESURF layer 246 has an n-type dopant concentration greater than that of n-type high-voltage well 548 to promote high conductivity within n-type high-voltage well 548. However, n-type dopant concentration of optional n-type RESURF layer 246 is not necessarily greater than that of HVNLDD 222 in this embodiment.

Figure 6:
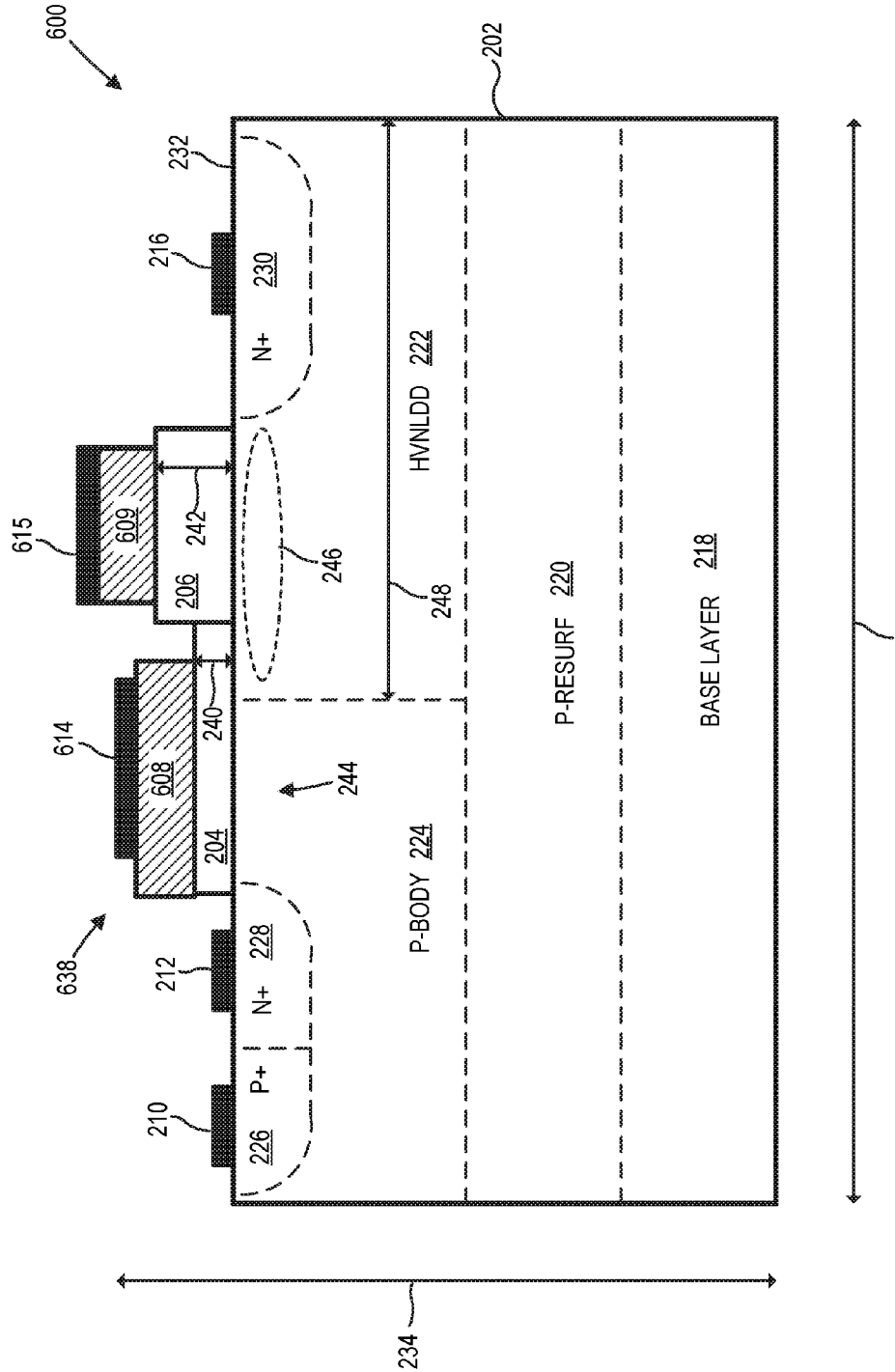
FIG. 6 is a cross-sectional view of a LDMOS transistor including a split-gate structure, according to an embodiment.

Applicant has further developed LDMOS transistors including a split-gate structure, to allow a gate over the drain-region to be biased independently of a gate over the source region. For example, FIG. 6 is a cross-sectional view of a LDMOS transistor 600, which is similar to LDMOS transistor 200 of FIG. 2, but includes a split-gate structure 638 including a first gate conductor 608 and a second gate conductor 609 in place of first gate conductor 208. First gate conductor 608 is disposed on first dielectric layer 204 in the thickness direction 234, and second gate conductor 609 is disposed on second dielectric layer 206 in the thickness direction 234. First gate conductor 608 is spatially separated from second gate conductor 609 in the lateral direction 236. A first gate electrode 614 contacts first gate conductor 608 to provide electrical interface to first gate conductor 608, and a second gate electrode 615 contacts second gate conductor 609 to provide electrical interface to second gate conductor 609.

Second gate conductor 609 can advantageously be used to promote both low on-resistance and high breakdown of LDMOS transistor 600. In particular, a positive bias voltage can be applied to second gate electrode 615 relative to source electrode 212 to cause negative charges to collect in HVNLDD 222 adjacent to second dielectric layer 206. These negative charges create a majority-carrier channel in HVNLDD 222, to promote low on-resistance in the current path through HVNLDD 222. A constant bias voltage is optionally applied to second gate electrode 615, i.e., bias voltage on second gate electrode 615 remains constant even as voltage on first gate electrode 614 changes during switching of LDMOS transistor 600, to promote low switching losses in LDMOS transistor 600 and simplicity of circuitry (not shown) biasing second gate electrode 615.

Figure 7:
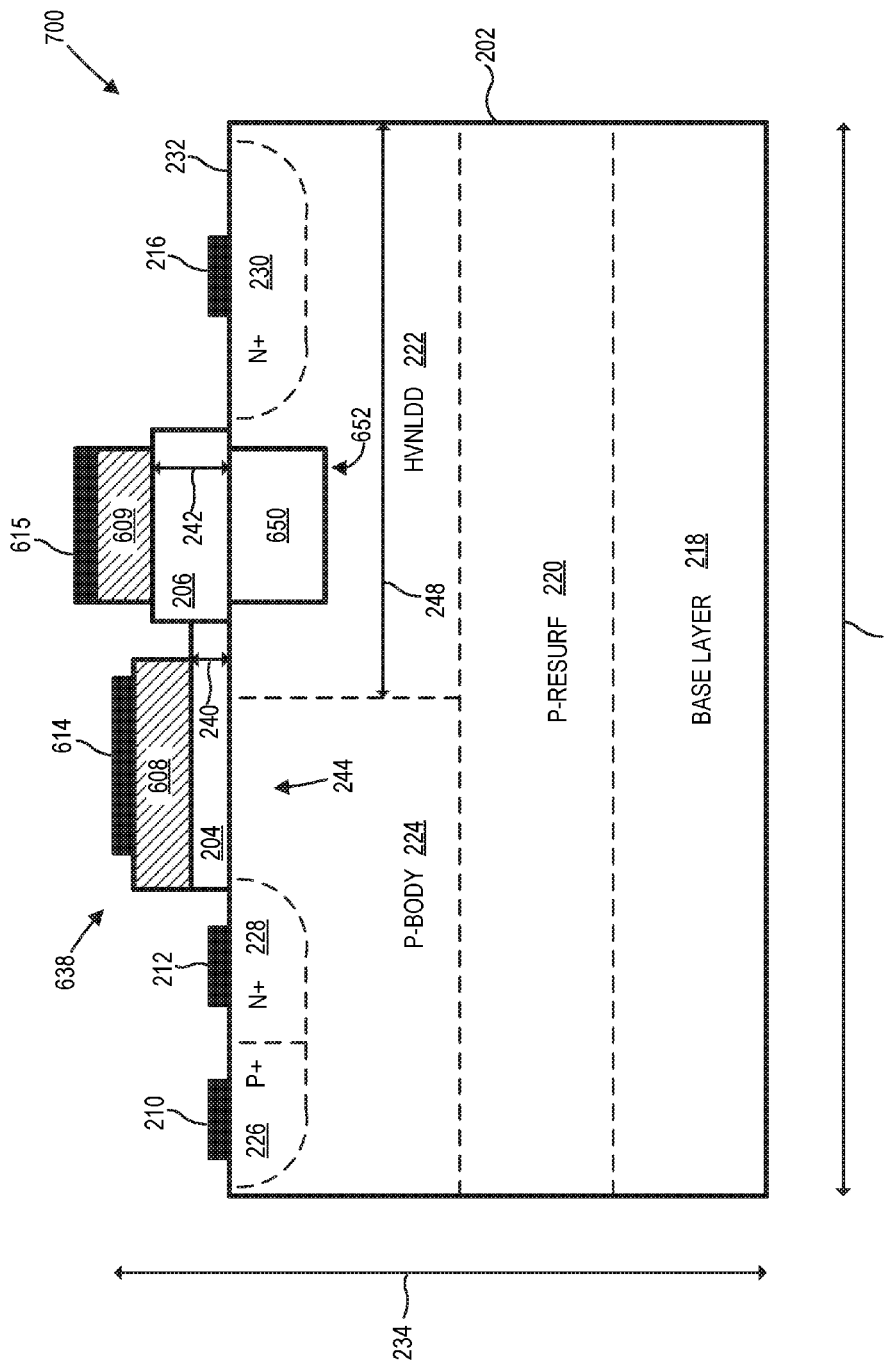
FIG. 7 is a cross-sectional view of a LDMOS transistor including a shallow trench isolation layer, according to an embodiment.

Applicant has determined that breakdown voltage can be further increased by forming a shallow trench isolation layer in the drain region under the gate structure. For example, FIG. 7 is a cross-sectional illustration of a LDMOS transistor 700, which is like LDMOS transistor 600 of FIG. 6, but further including a shallow trench isolation layer 650 disposed in a trench 652 in silicon semiconductor structure 202 under second dielectric layer 206 in the thickness 234 direction. Shallow trench isolation layer 650 combined with biased second gate electrode 615 promotes high breakdown voltage of LDMOS transistor 700 by balancing potential and electric field within HVNLDD 222.

Figure 8:
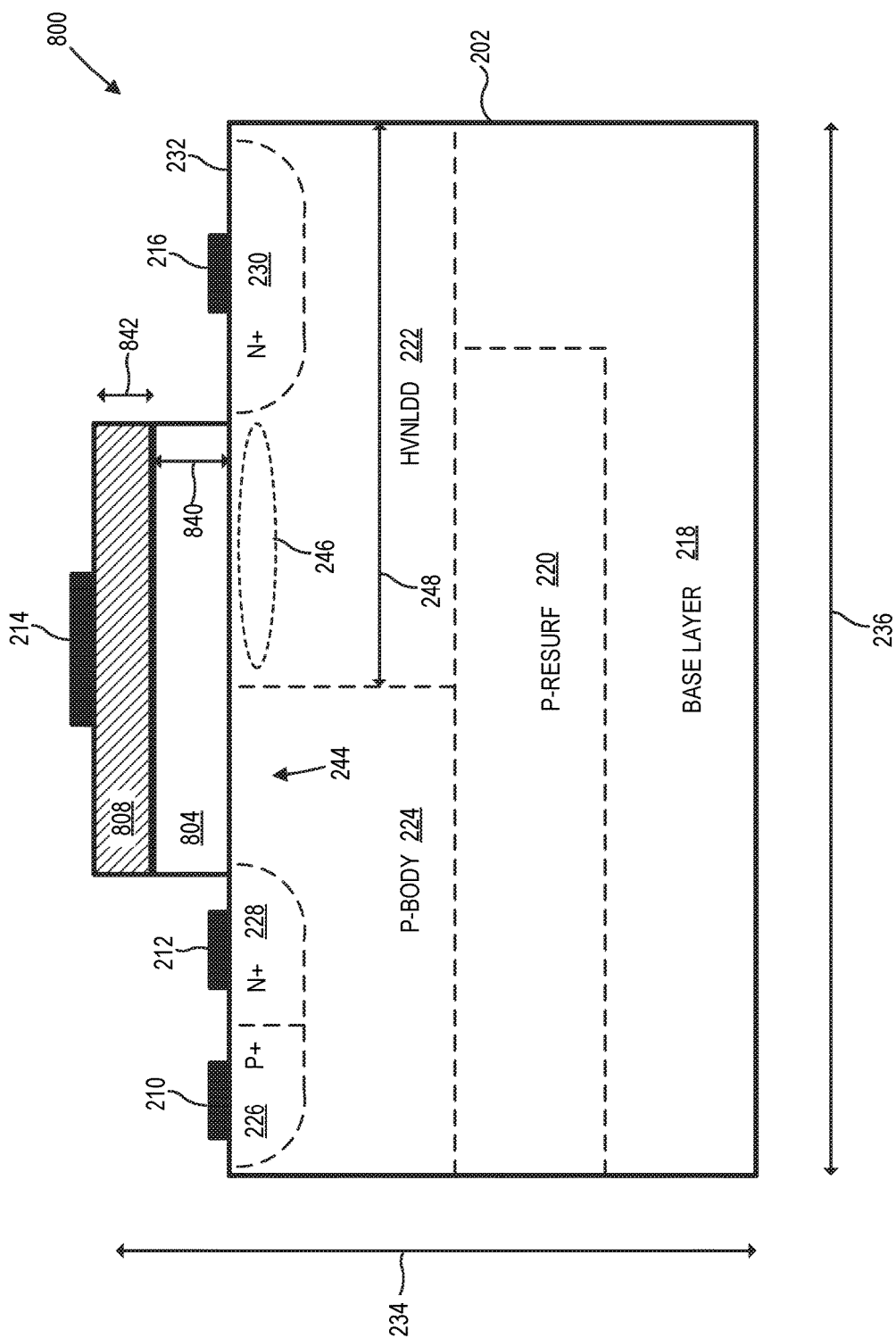
FIG. 8 is a cross-sectional view of a LDMOS transistor including a uniform gate structure, according to an embodiment.

A high breakdown voltage and a low threshold voltage might not both be required in some applications. Accordingly, the gate structure in any of the embodiments disclosed herein could be modified to have a uniform thickness, to promote ease of manufacturing with the potential tradeoff of inability to achieve both high breakdown voltage and low threshold voltage $V_{th}$. For example, FIG. 8 is a cross-sectional view of a LDMOS transistor 800 which is similar to LDMOS transistor 300 of FIG. 3, but with a uniform gate structure. First and second dielectric layers 204 and 206 are replaced with a single dielectric layer 804 of uniform thickness 840, and gate conductor 208 is replaced with a gate conductor 808 of uniform thickness 842. A small value of thickness 840 will cause LDMOS transistor 800 to have a relatively small threshold voltage $V_{th}$, with the potential drawback of a low breakdown voltage. Conversely, a large value of thickness 840 will cause LDMOS transistor 800 to have a relatively large breakdown voltage, with the potential drawback of a high threshold voltage $V_{th}$.

Figure 9:
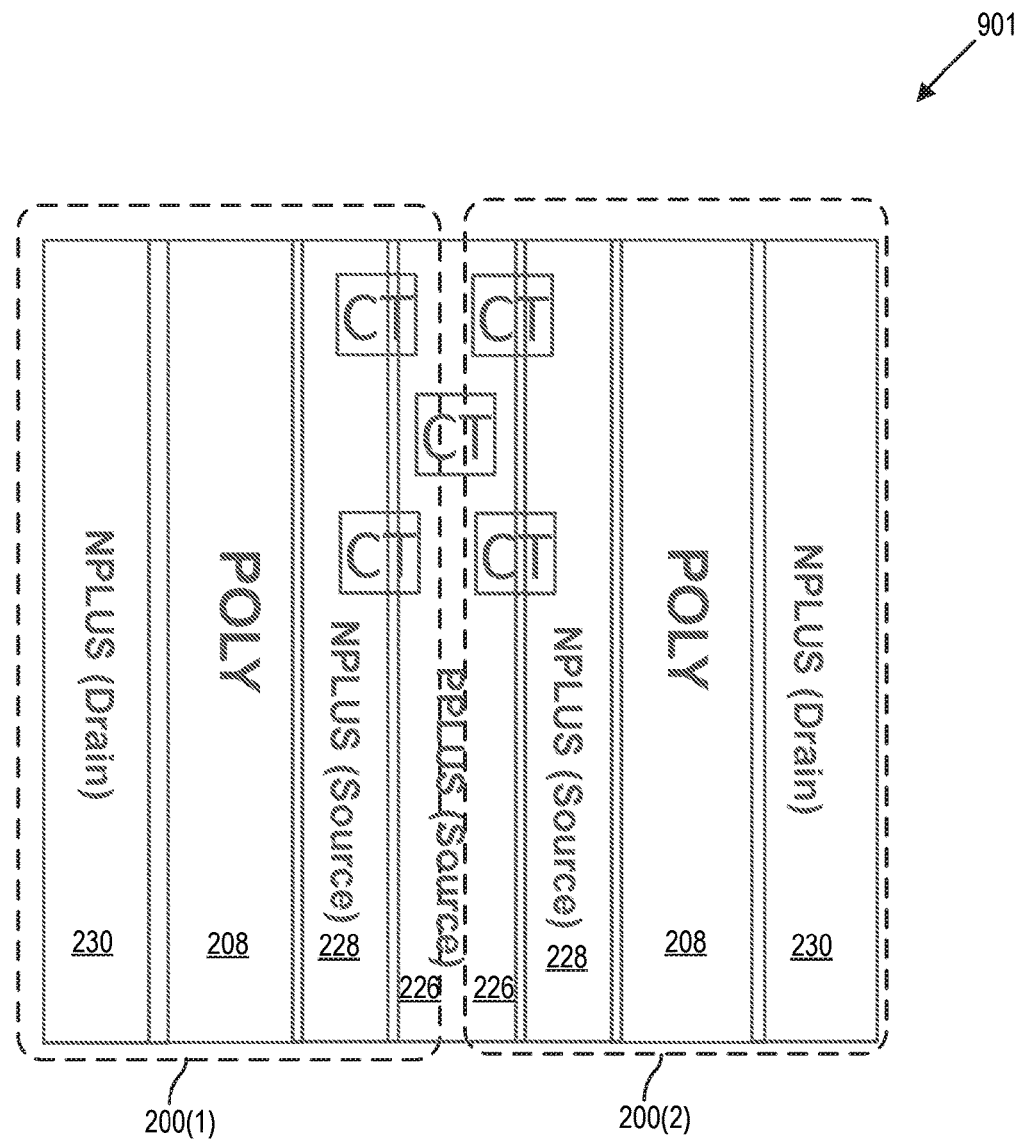
FIG. 9 is a top plan view of a silicon substrate including two instances of the FIG. 2 LDMOS transistor, according to an embodiment.

A plurality of the LDMOS transistors disclosed herein could be formed on a common silicon substrate, and two or more of such transistors could share one or more elements, such as electrodes. Such plurality of transistors need not necessarily have the same configuration. For example, FIG. 9 is a top plan view of a silicon substrate 901 including two instances of LDMOS transistor 200, designated as LDMOS transistor 200(1) and LDMOS transistor 200(2). Elements CT are contacts implementing both body electrode 210 and source electrode 212, to provide electrical interface to source p+ region 226 and source n+ region 228.

Additionally, one or more of the LDMOS transistors disclosed herein could be formed on a common silicon substrate with other electronic devices, such as complementary metal-oxide-semiconductor (CMOS) transistors. For example, one or more of the LDMOS transistors disclosed herein could be formed on a common silicon substrate with additional electronic devices to form a system, such as a switching power converter switching stage, on a single integrated circuit chip.

The source p+ region is adjacent to the source n+ region in the lateral direction in the LDMOS transistors illustrated in FIGS. 2-8. However, any of the embodiments disclosed herein could be modified such that the source p+ region is adjacent to the source n+ region in the depth direction to achieve a compact source layout, where the depth direction is orthogonal to each of the thickness and lateral directions. The compact source configuration promotes small device pitch and small device on-resistance.

Figure 10:
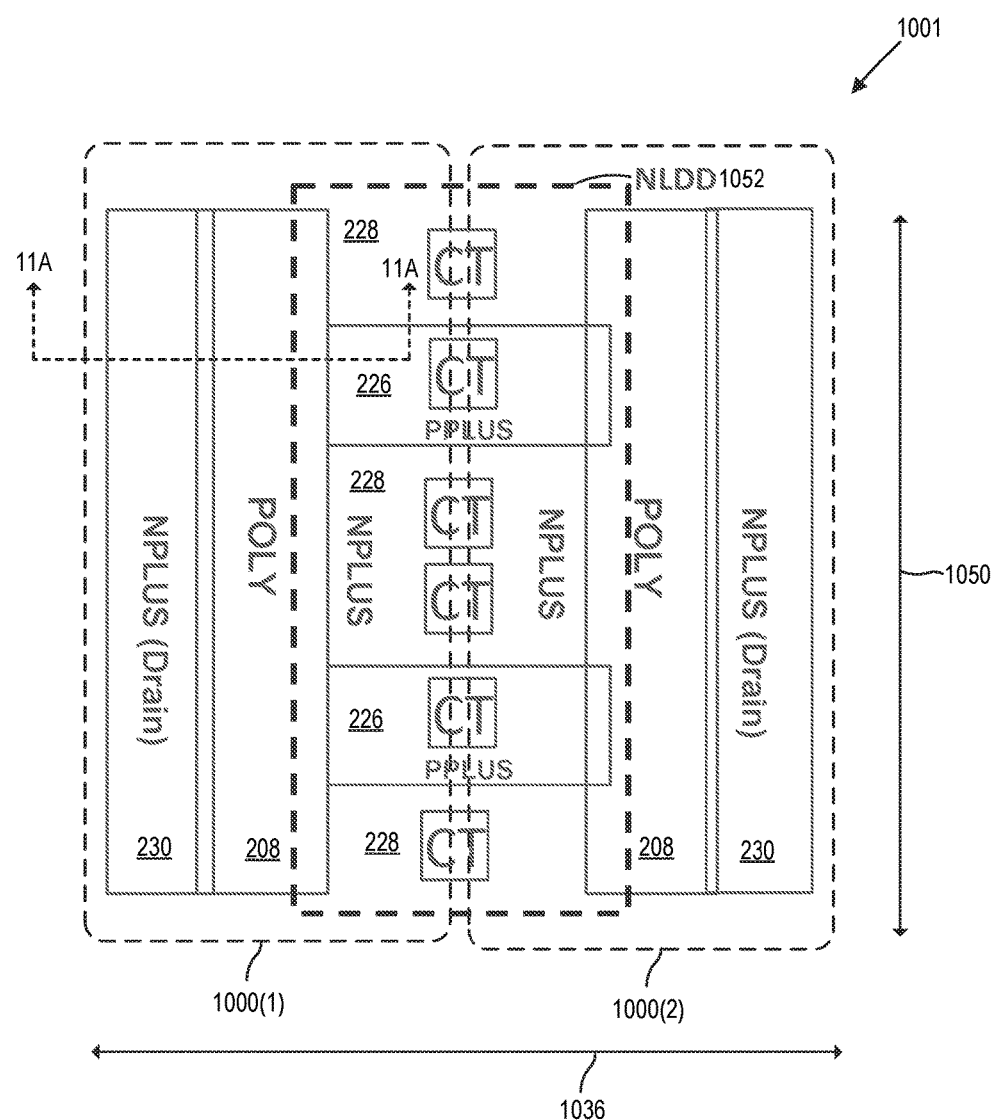
FIG. 10 is a top plan view of a silicon substrate including two LDMOS transistors having a compact source layout, according to an embodiment.
Figure 11:
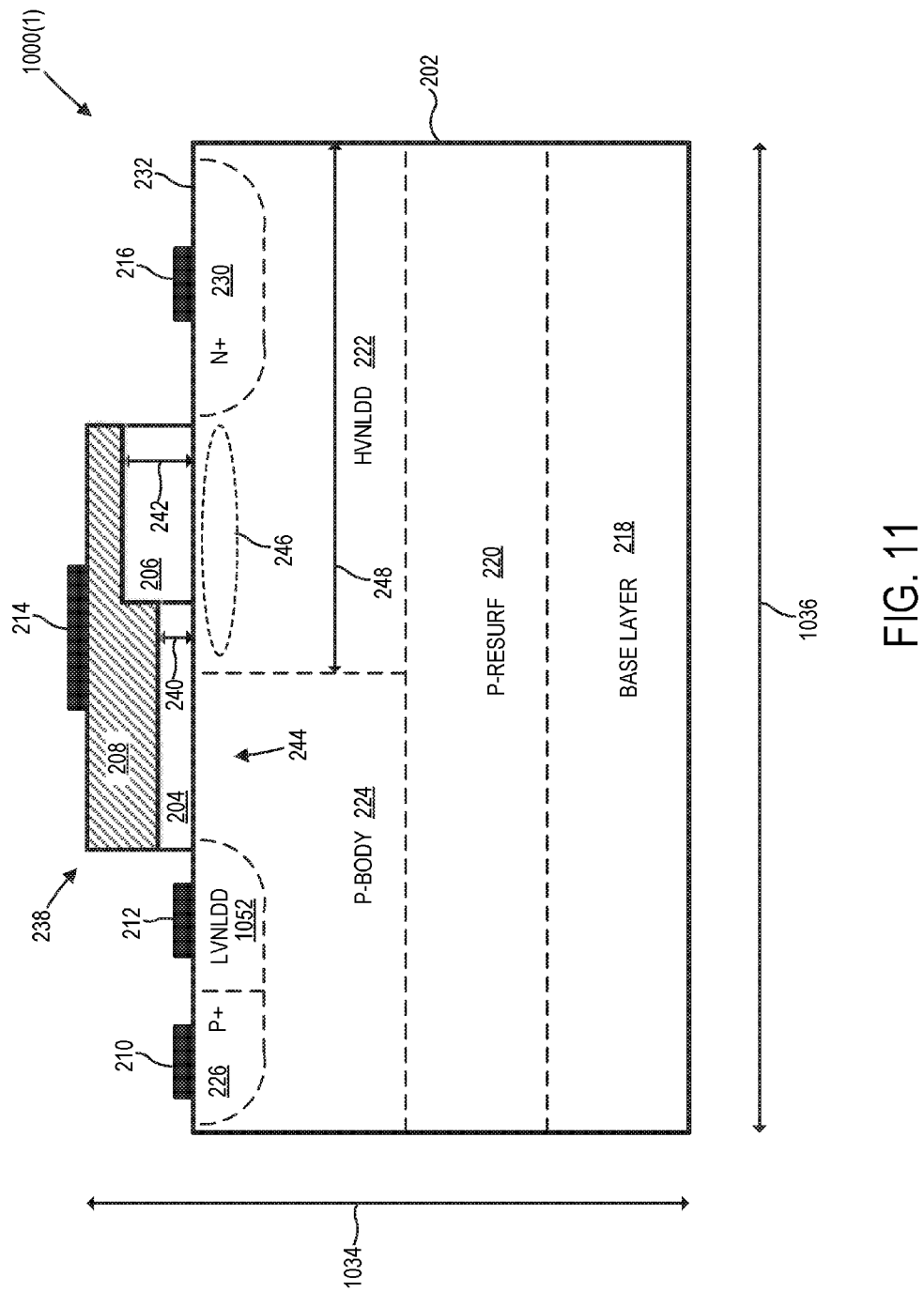
FIG. 11 is a cross-sectional view of a portion of the FIG. 10 silicon substrate.

For example, FIG. 10 is a top plan view of two LDMOS transistors 1000(1) and 1000(2) having a compact source layout and formed on a common silicon substrate 1001. FIG. 11 is a cross-sectional view of silicon semiconductor substrate 1001 taken along line 11A-11A of FIG. 10. Each of LDMOS transistors 1000(1) and 1000(2) is similar to LDMOS transistor 200, but has a source region configured so that source p+ region 226 is disposed adjacent to source n+ region 228 in a depth direction 1050, where the depth direction 1050 is orthogonal to a lateral direction 1036 and a thickness 1034 direction. A low-voltage n-type laterally diffused drain (LVNLDD) 1052 is disposed over the p-body of each of LDMOS transistors 1000(1) and 1000(2). Each of source p+ region 226 and source n+ region 228 extends at least partially into LVNLDD 1052 in the thickness direction.

Figure 12:
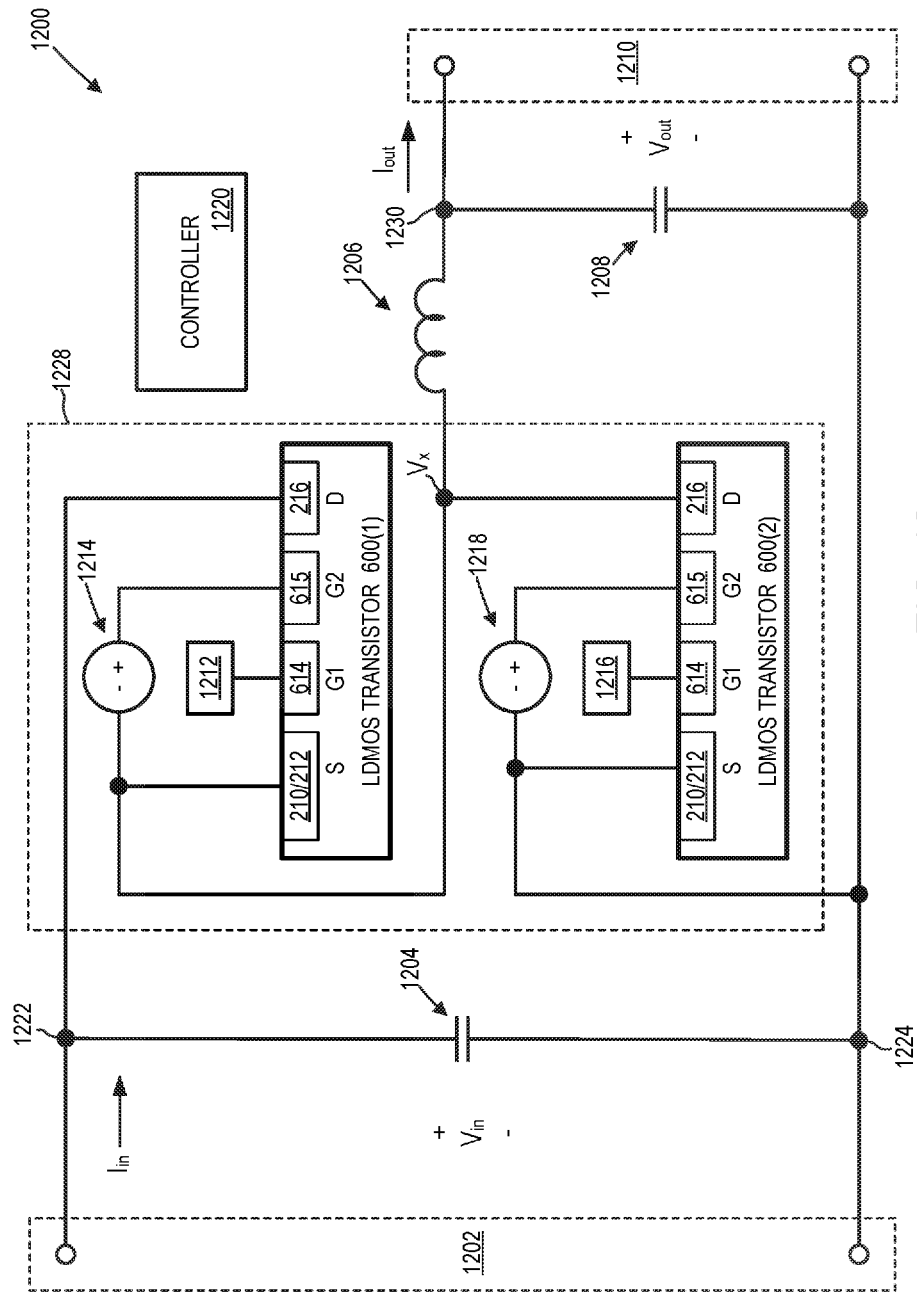
FIG. 12 schematically illustrates a buck converter including two instances of the FIG. 6 LDMOS transistor, according to an embodiment.

One possible application of the LDMOS transistors disclosed herein is in a switching power converter. For example, FIG. 12 schematically illustrates a buck converter 1200 including two instances of LDMOS transistor 600, hereinafter referred to as LDMOS transistor 600(1) and LDMOS transistor 600(2). LDMOS transistors 600(1) and 600(2) are schematically illustrated in FIG. 12 to promote illustrative clarity. Buck converter 1200 further includes an input port 1202 electrically coupled to an input power source (not shown), an input capacitor 1204, an inductor 1206, an output capacitor 1208, an output port 1210 electrically coupled to a load (not shown), first driver circuitry 1212, first bias circuitry 1214, second driver circuitry 1216, second bias circuitry 1218, and a controller 1220.

Input port 1202 is electrically coupled across a positive input node 1222 and a reference node 1224. Input capacitor 1204 is electrically coupled across positive input node 1222 and reference node 1224, and input capacitor 1204 provides a path for input ripple current drawn by buck converter 1200. Drain electrode 216 of LDMOS transistor 600(1) is electrically coupled to positive input node 1222, and source electrode 212 and body electrode 210 of LDMOS transistor 200(1) are each electrically coupled to a switching node $V_x$. First gate electrode 614 and second gate electrode 615 of LDMOS transistor 600(1) are electrically coupled to first driver circuitry 1212 and first bias circuitry 1214, respectively. Drain electrode 216 of LDMOS transistor 600(2) is electrically coupled to switching node $V_x$, and each of source electrode 212 and body electrode 210 of LDMOS transistor 600(2) is electrically coupled to reference node 1224. First gate electrode 614 and second gate electrode 615 of LDMOS transistor 600(2) are electrically coupled to second driver circuitry 1216 and second bias circuitry 1218, respectively. LDMOS transistors 600(1) and 600(2), first driver circuitry 1212, first bias circuitry 1214, second driver circuitry 1216, and second bias circuitry 1218 collectively form a switching circuit 1228. Inductor 1206 is electrically coupled between switching node $V_x$ and a positive output node 1230, and output port 1210 is electrically coupled across positive output node 1230 and reference node 1224. Output capacitor 1208 is electrically coupled across positive output node 1230 and reference node 1224, and output capacitor 1208 provides a path for output ripple current generated by buck converter 1200.

Controller 1220 controls switching of switching circuit 1228 to transfer power from the power source (electrically coupled to input port 1202) to the load (electrically coupled to output port 1210). In particular, controller 1220 is configured to control first driver circuitry 1212 to repeatedly switch first gate electrode 614 of LDMOS transistor 600(1) between two different voltage magnitudes, to repeatedly create and destroy a minority-carrier channel in p-body 224 of LDMOS transistor 600(1). Consequentially, LDMOS transistor 600(1) repeatedly switches between its conductive and non-conductive states under the control of controller 1220. Controller 1220 is also configured to control second driver circuitry 1216 to repeatedly switch first gate electrode 614 of LDMOS transistor 600(2) between two different voltage magnitudes to cause LDMOS transistor 600(2) to repeatedly switch between its conductive and non-conductive states. Controller 1220 is configured to control switching of LDMOS transistor 600(2) such that it provides a freewheeling function, or in other words, so that LDMOS transistor 600(2) provides a path for current flowing through inductor 1206 when LDMOS transistor 600(1) is in its non-conductive state. In some embodiments, controller 1220 is configured to control switching of switching circuit 1228 to regulate one or more parameters of buck converter 1200, such as input voltage $V_{in}$, input current $I_{in}$, input power $P_{in}$, output voltage $V_{out}$, output current $I_{out}$, and output power $P_{out}$. Connections between controller 1220 and other components of buck converter 1200 are not shown to promote illustrative clarity.

First bias circuitry 1214 is configured to maintain a constant voltage on second gate electrode 615 of LDMOS transistor 600(1) to establish a majority-carrier channel in HVNLDD 222 of the transistor, thereby promoting low on-resistance and high breakdown voltage of the transistor. Similarly, second bias circuitry 1218 is configured to maintain a constant voltage on second gate electrode 615 of LDMOS transistor 600(2) to establish a majority-carrier channel in HVNLDD 222 of the transistor, thereby promoting low on-resistance and high breakdown voltage of the transistor.

Buck converter 1200 could be modified to replace LDMOS transistors 600(1) and 600(2) with other embodiments of the LDMOS transistors disclosed herein. For example, LDMOS transistors 600(1) and 600(2) are replaced with respective instances of LDMOS transistor 200 in an alternate embodiment. First bias circuitry 1214 and second bias circuitry 1218 are omitted in this alternate embodiment because LDMOS transistor 200 does not include two separate gate conductors.

It should be appreciated that the LDMOS transistors disclosed herein are not limited to use in a buck converter, or even to use in a switching power converter. For example, the LDMOS transistors disclosed herein could alternately be used in an amplifier.

Figure 13:
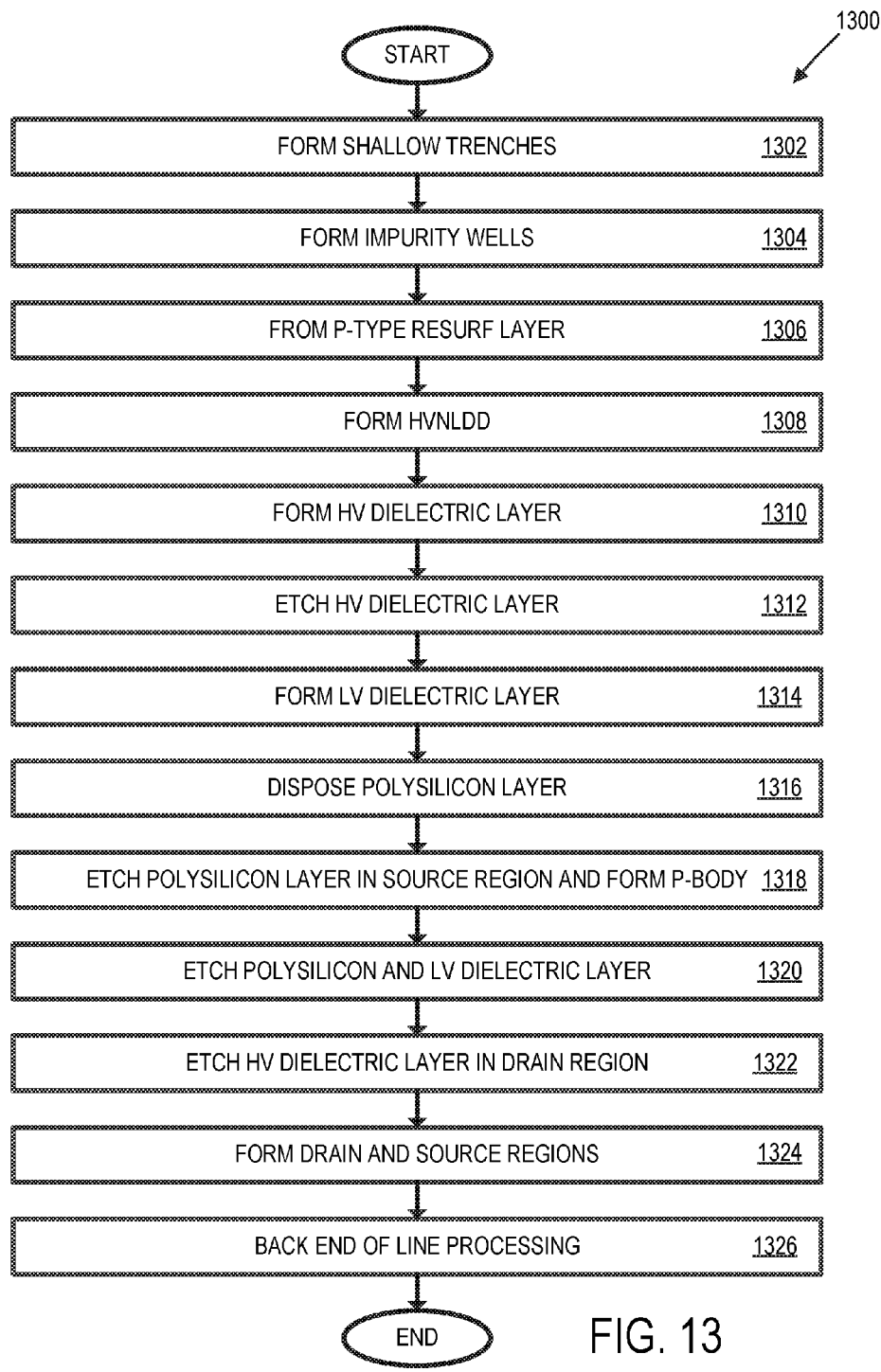
FIG. 13 illustrates a method for forming an integrated circuit including a LDMOS transistor and a complementary metal-oxide-semiconductor transistor, according to an embodiment.

FIG. 13 illustrates a method 1300 for forming an integrated circuit including a LDMOS transistor and a CMOS transistor. Method 1300 is used, for example, to form one or more of the LDMOS transistors disclosed herein with one or more CMOS transistors. However, the LDMOS transistors disclosed herein could alternately be formed using different methods. Additionally, method 1300 could be used to form LDMOS transistors other than those disclosed herein. FIGS. 14A-L illustrate one example of method 1300 forming an integrated circuit 1400 including an instance of LDMOS transistor 200 and a CMOS transistor 1402. FIGS. 13 and 14 are best viewed together in the following description.

Figure 14A:
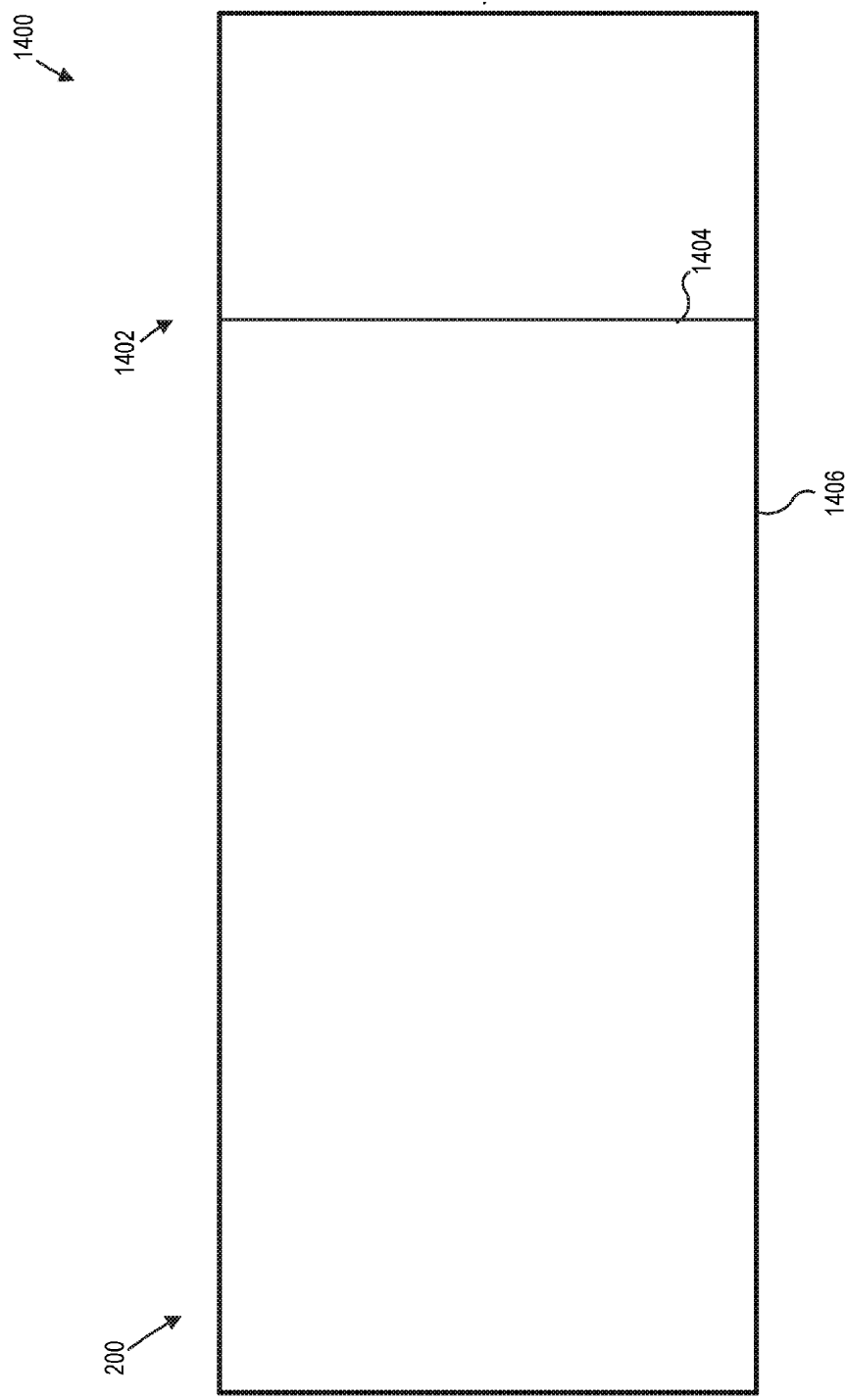
FIGS. 14A-14L illustrate one example of an integrated circuit being formed according to the method of FIG. 13, according to an embodiment.
Figure 14B:
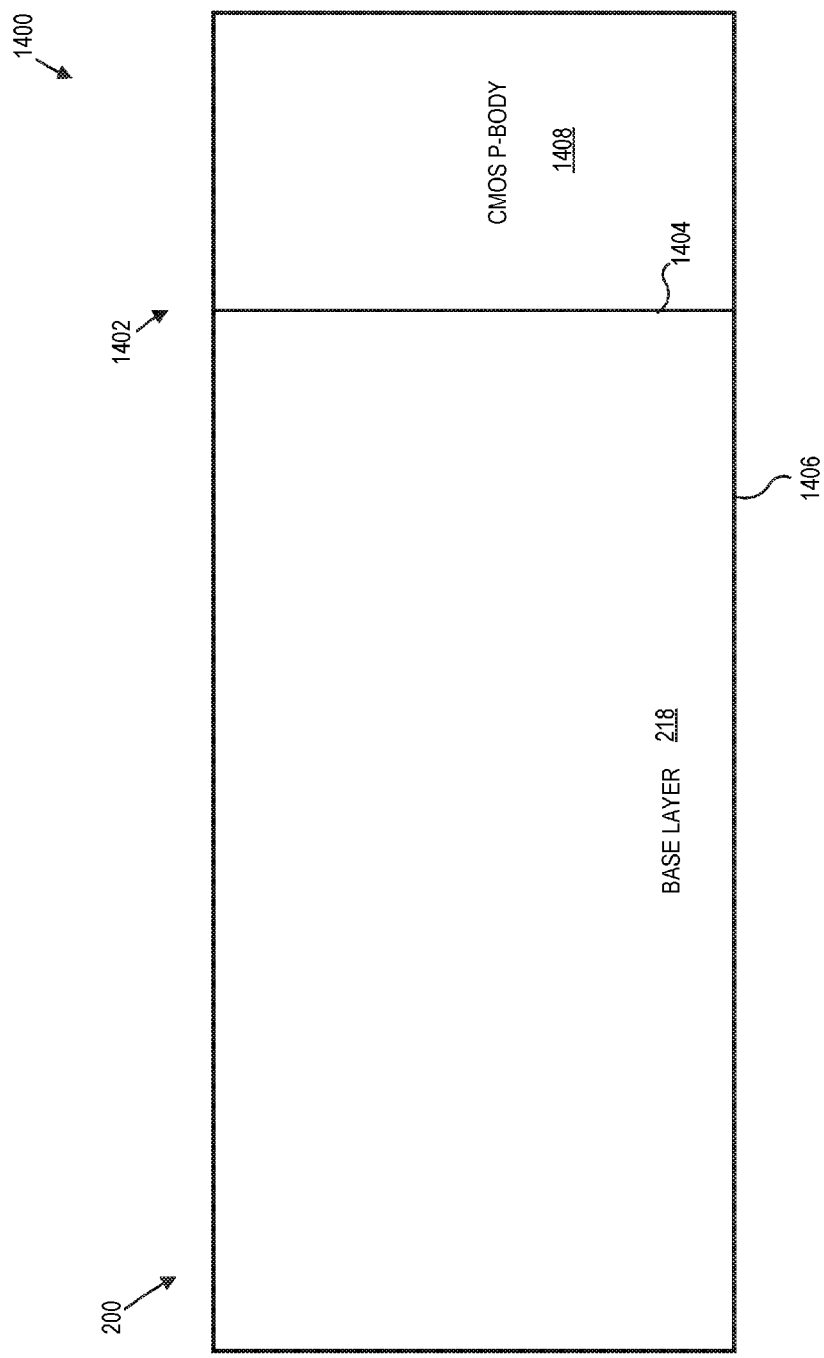
Figure 14C:
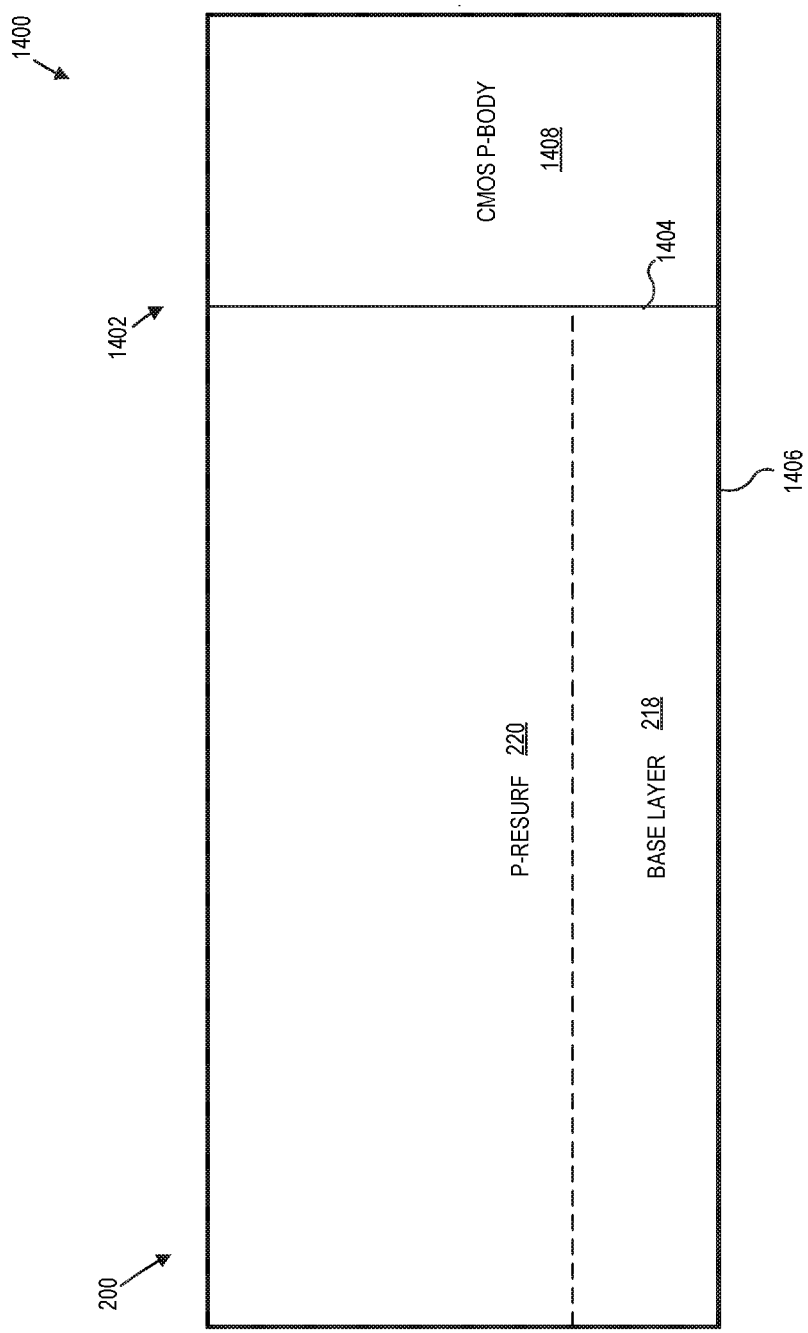

Method 1300 begins with step 1302 of forming one or more shallow trenches in a silicon wafer, to at least partially delineate the LDMOS transistor from the CMOS transistor. In one example of step 1302 illustrated in FIG. 14A, a shallow trench 1404 is formed in a silicon wafer 1406 to delineate LDMOS transistor 200 from CMOS transistor 1402. A LDMOS transistor impurity well and a CMOS transistor impurity well are each formed in the silicon wafer in step 1304. In one example of step 1304 illustrated in FIG. 14B, n-type dopants are implanted into silicon wafer 1406 on a left side of shallow trench 1404 to form an n-type high-voltage well to serve as base layer 218, and p-type dopants are implanted into silicon wafer 1406 on a right side of shallow trench 1404 to form a CMOS transistor p-body 1408. In step 1306, a p-type RESURF layer is formed in the LDMOS transistor impurity well. In one example of step 1306, p-type dopants are implanted into base layer 218 to form p-type RESURF layer 220, as illustrated in FIG. 14C.

Figure 14D:
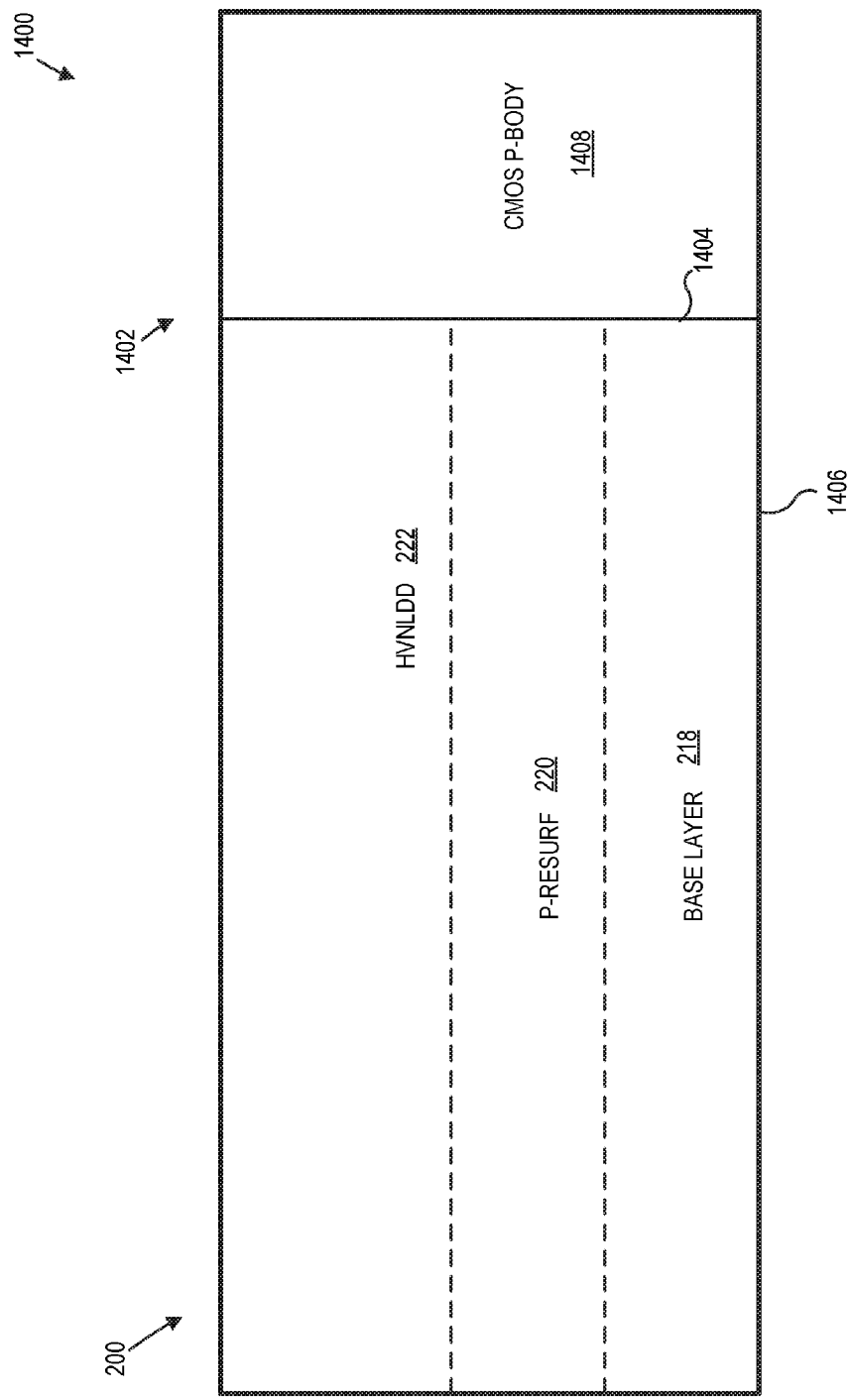
Figure 14E:
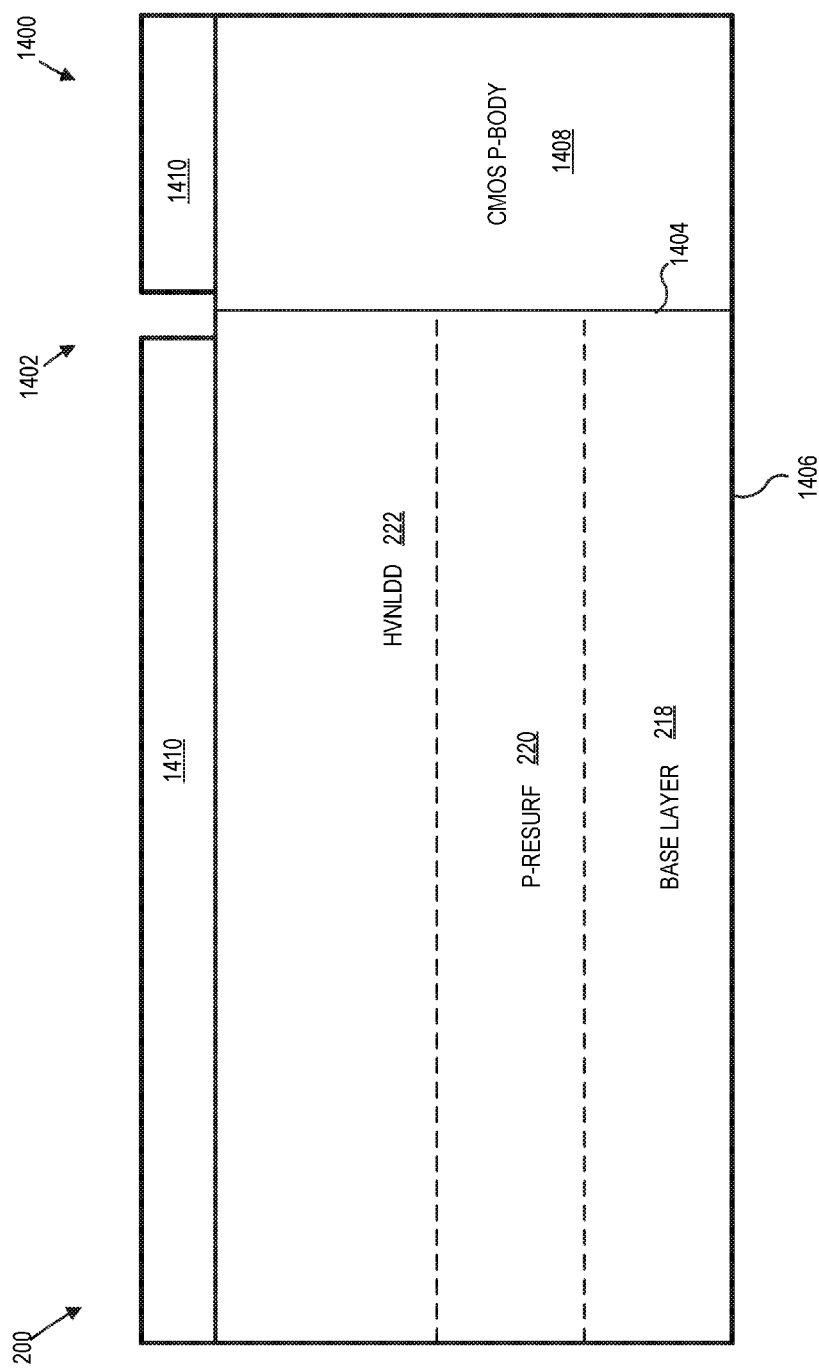
Figure 14F:
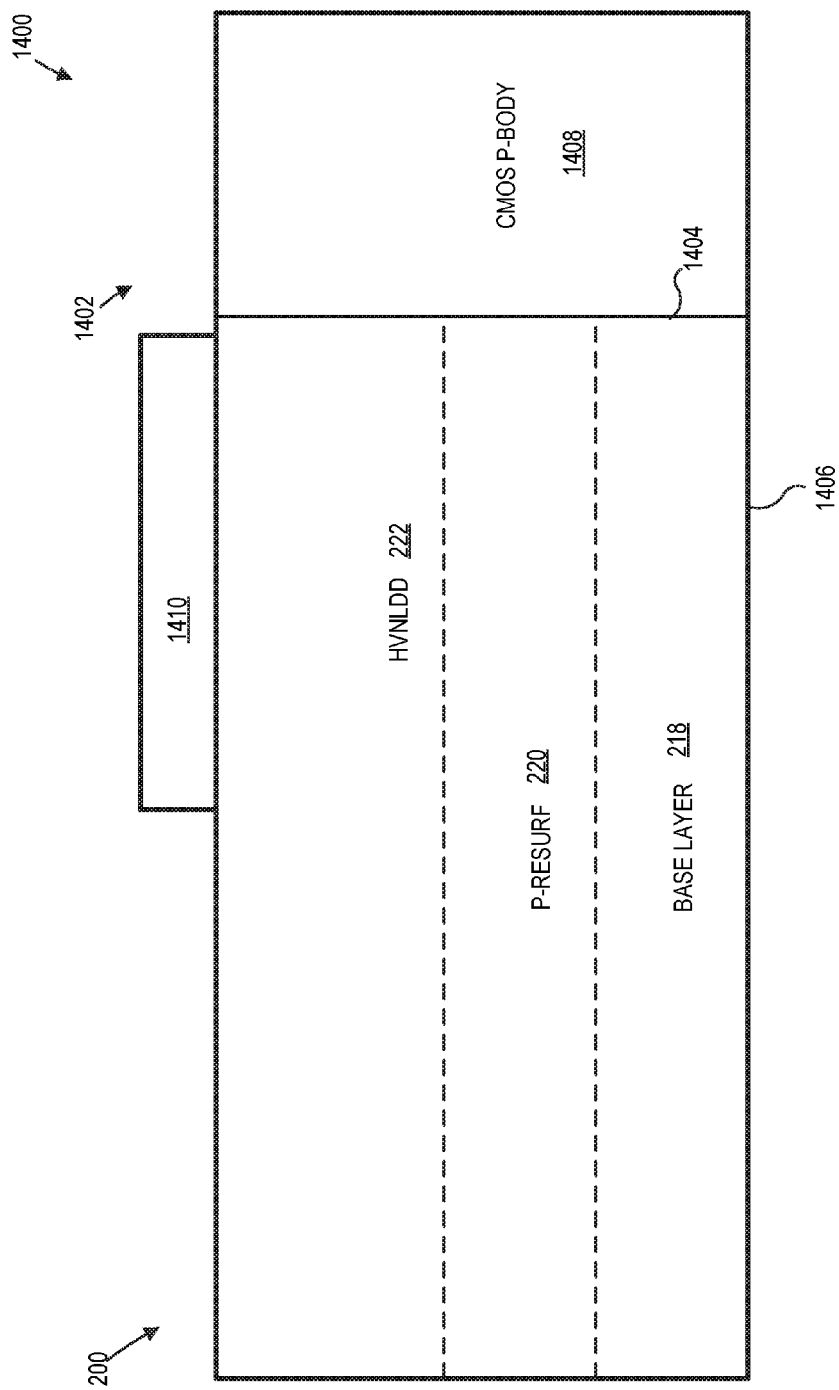
Figure 14G:
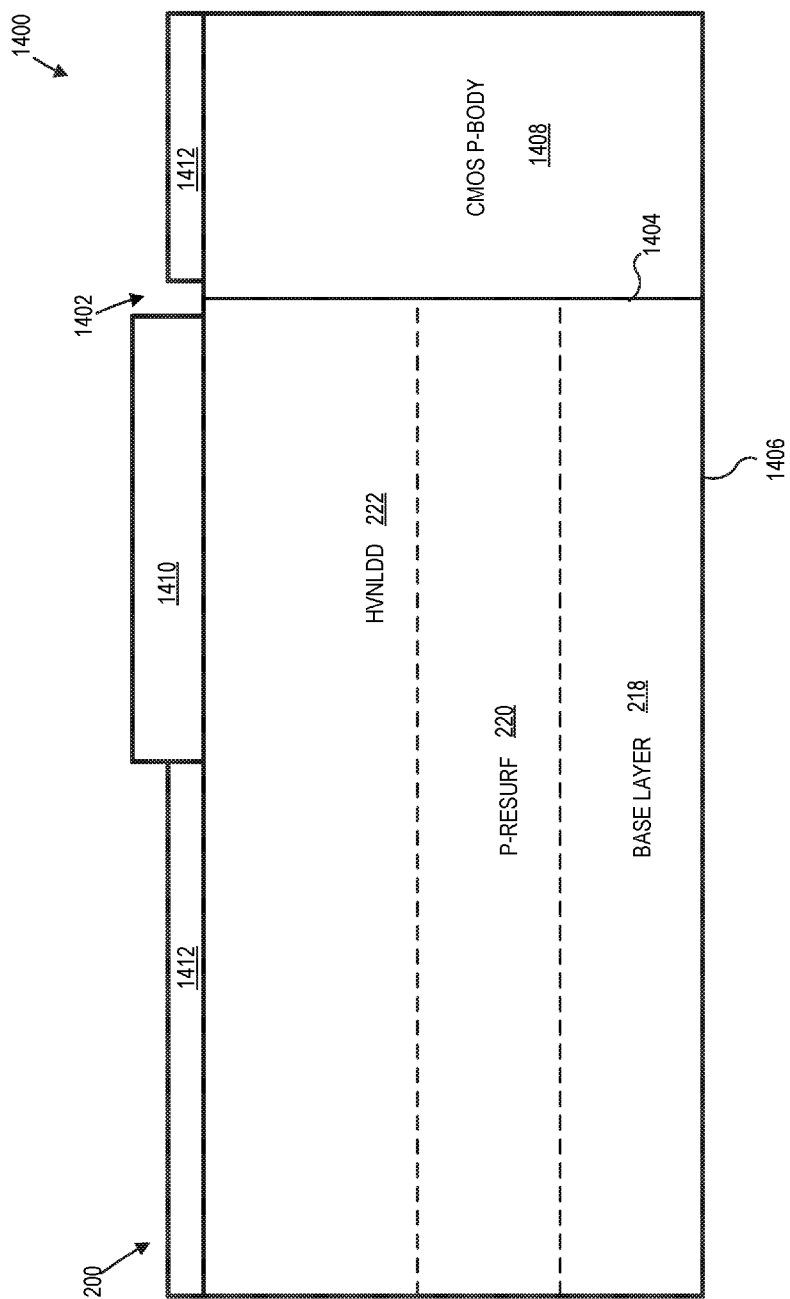

In step 1308, a high-voltage n-type laterally diffused-drain is formed in the LDMOS transistor impurity well. In one example of step 1308 as illustrated in FIG. 14D, n-type dopants are implanted into base layer 218 to form HVNLDD 222. In step 1310, a high-voltage dielectric layer is formed on a first outer surface of the silicon wafer. In one example of step 1310, a high-voltage dielectric layer 1410 is disposed on silicon wafer 1406, as illustrated in FIG. 14E. In step 1312, the high-voltage dielectric layer is etched so it that it extends only over a portion of the LDMOS transistor. In one example of step 1312 illustrated in FIG. 14F, high-voltage dielectric layer 1410 is etched to extend only over a portion of LDMOS transistor 200. In step 1314, a low-voltage dielectric layer is formed on the first outer surface of the silicon wafer. In one example of step 1314, a low-voltage dielectric layer 1412 is disposed on silicon wafer 1406, as illustrated in FIG. 14G.

Figure 14H:
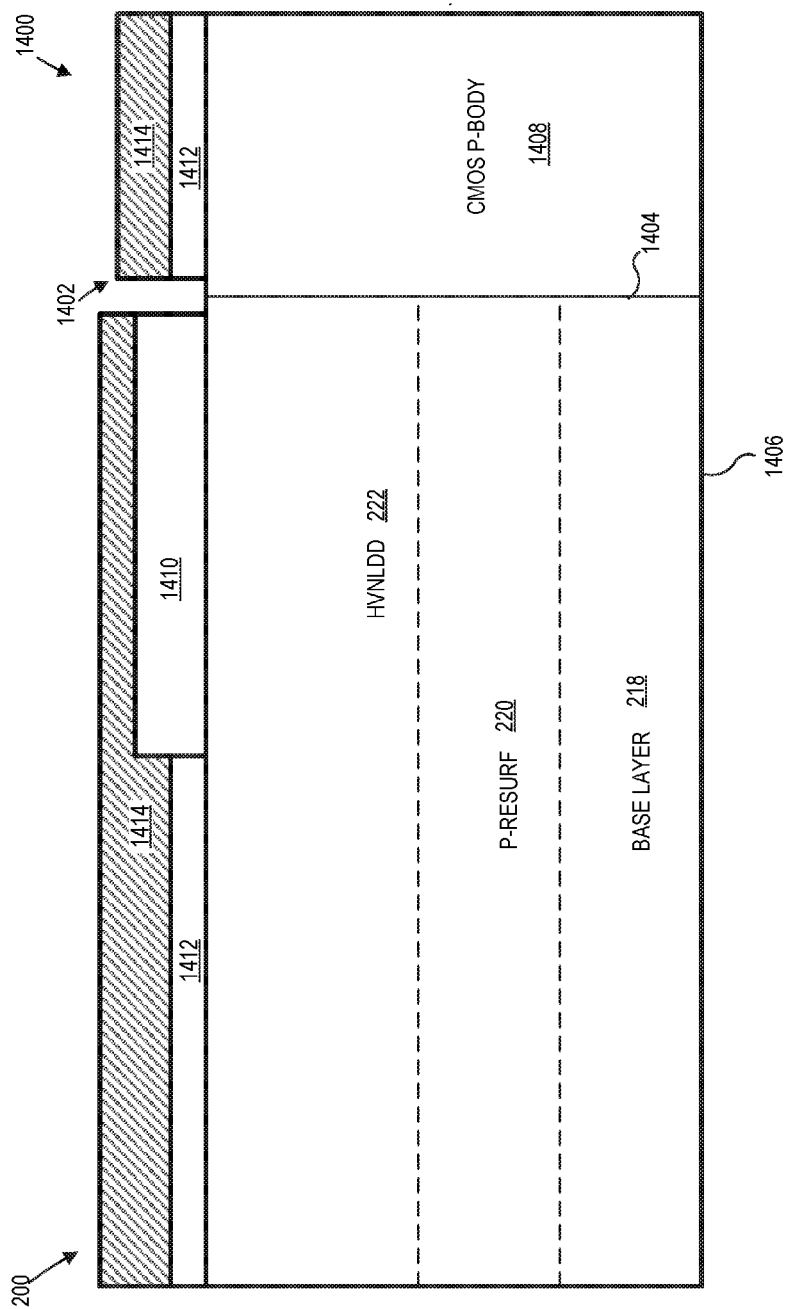
Figure 14I:
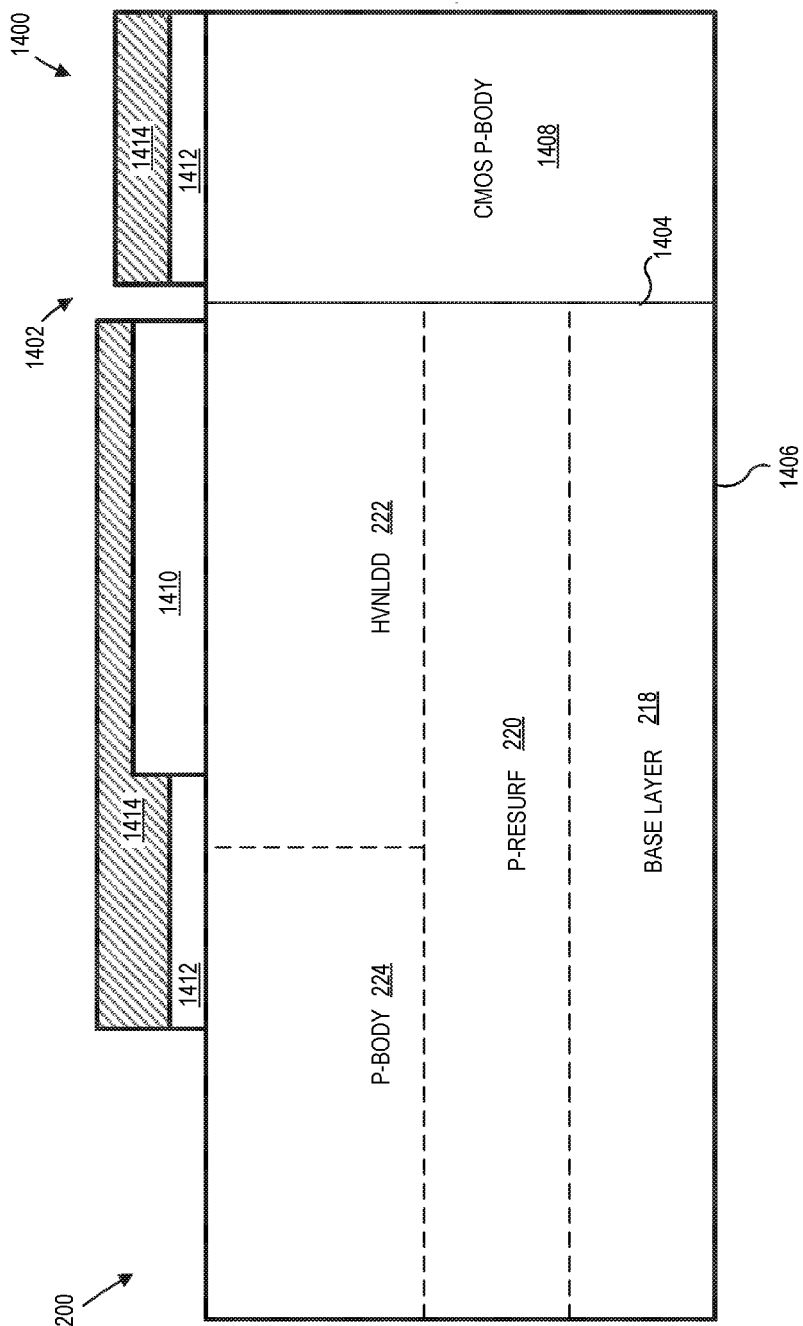

A polysilicon layer is disposed over the first outer surface of the silicon wafer in step 1316. In one example of step 1316 as illustrated in FIG. 14H, a polysilicon layer 1414 is disposed on silicon wafer 1406 over high-voltage dielectric layer 1410 and low voltage dielectric layer 1412. In step 1318, the polysilicon layer is etched in the source region of the LDMOS transistor to allow formation of a p-body in the LDMOS transistor impurity well, and the p-body is then formed. In one example of step 1318 illustrated in FIG. 14I, polysilicon layer 1414 is etched in the source region of LDMOS transistor 200, and a chain of p-type dopants are implanted into base layer 218 to form p-body 224 using the LDMOS transistor's gate structure as a mask. A LVNLDD, such as LVNLDD 1052 of FIG. 10, is optionally also formed in step 1318.

Figure 14J:
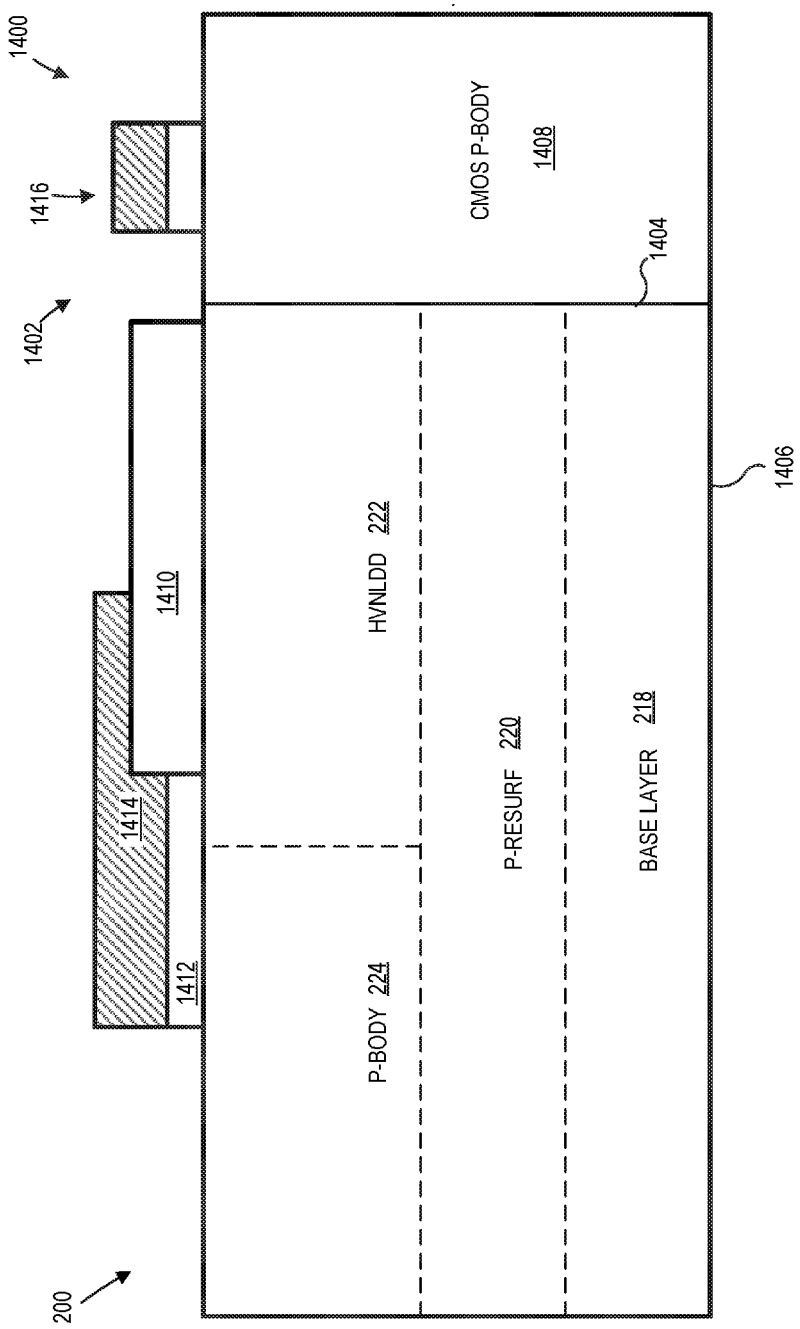
Figure 14K:
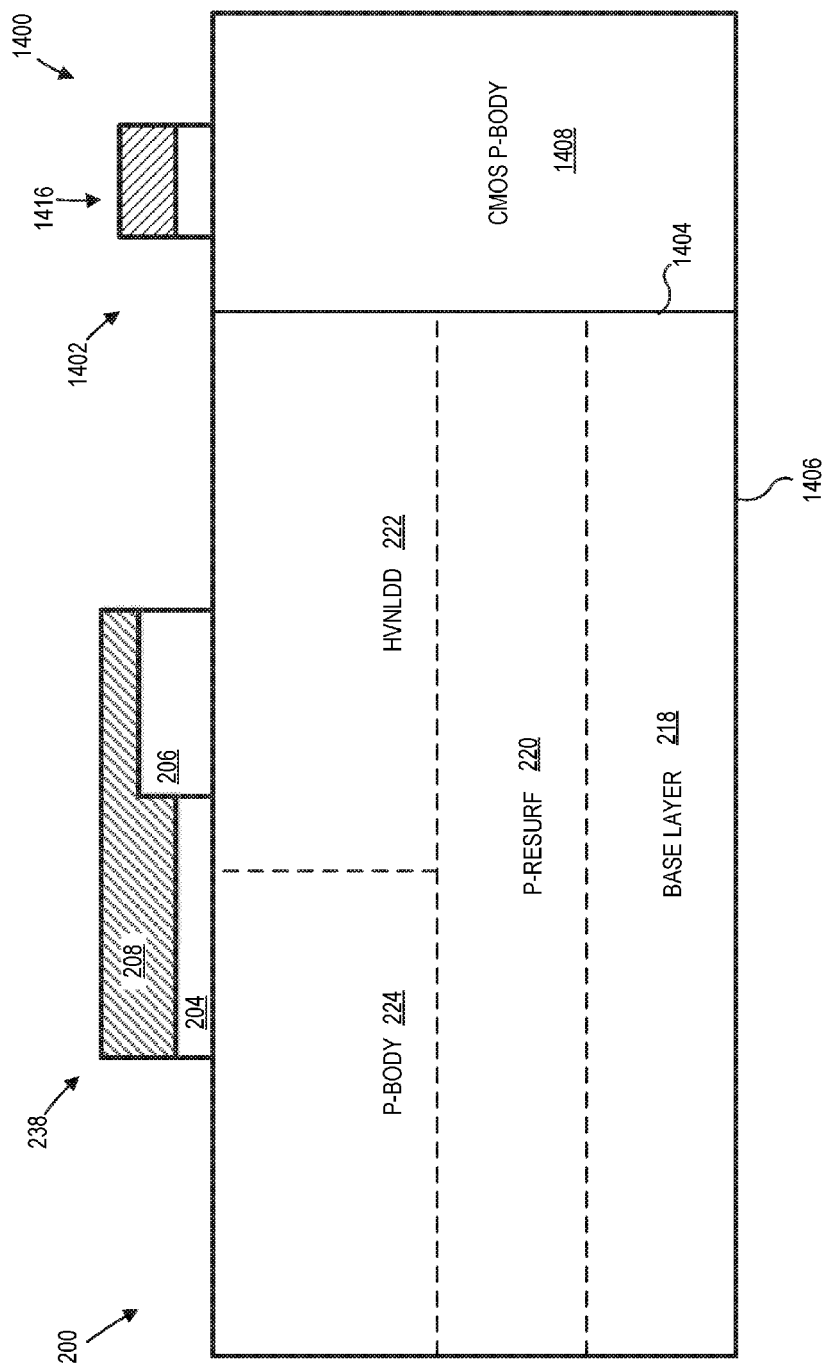

In step 1320, the polysilicon layer is etched over the drain region of the LDMOS transistor. Additionally, the low-voltage dielectric layer and the polysilicon layer are etched to form a gate structure of the CMOS transistor. In one example of step 1320, polysilicon layer 1414 is etched over the drain region of LDMOS transistor 200, and polysilicon layer 1414 and low-voltage dielectric layer 1412 are etched over CMOS transistor 1404 to form a CMOS gate structure 1416, as illustrated in FIG. 14J. In step 1322, the high-voltage dielectric layer is etched over the drain region of the LDMOS transistor to form the LDMOS transistor's gate structure. In one example of step 1322, high-voltage dielectric layer 1410 is etched to form stepped-gate structure 238, as illustrated in FIG. 14K.

Figure 14L:
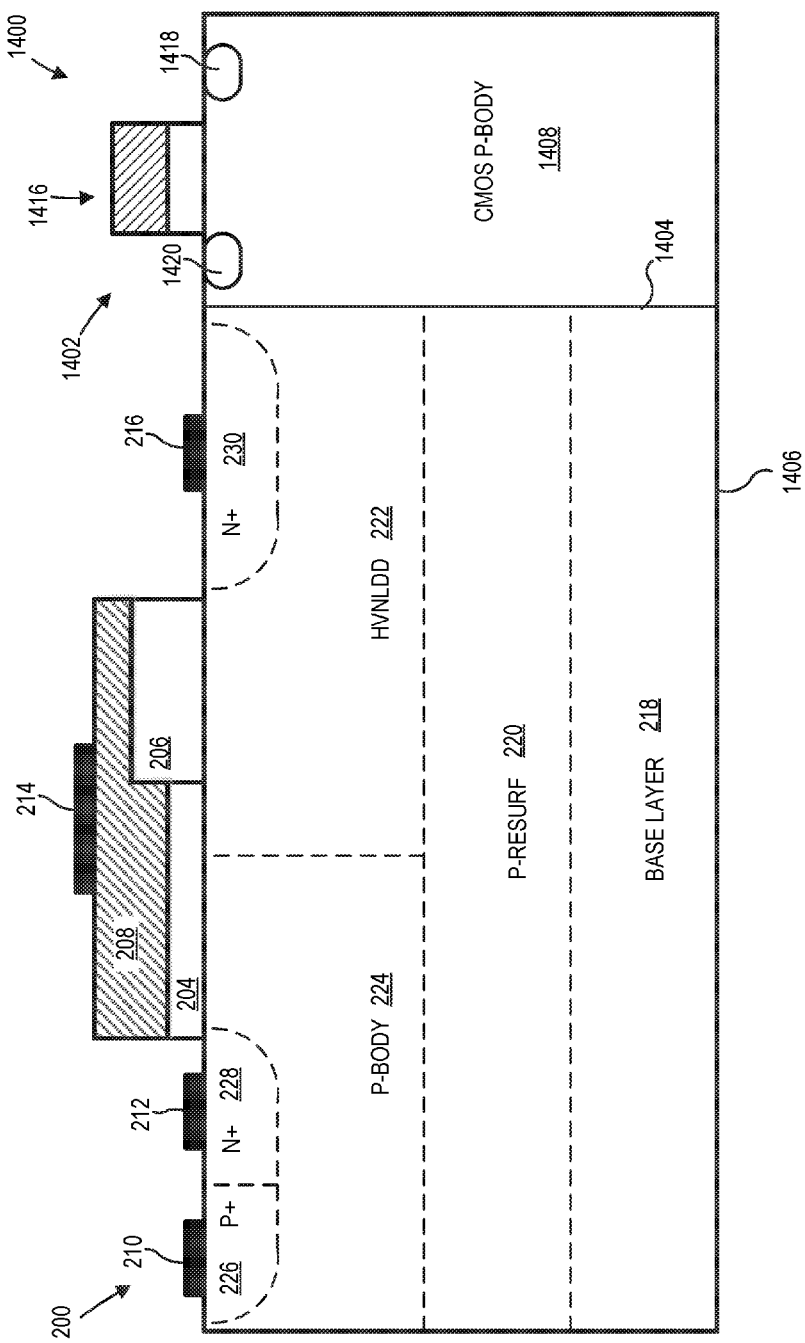

In step 1324, a drain region and a source region are formed for each of the LDMOS transistor and the CMOS transistor. In one example of step 1324, each of drain n+ region 230, source p+ region 226, and source n+ region 228 are implanted into base layer 218, and drain n+ region 1418 and source n+ region 1420 are implanted in CMOS transistor p-body 1408, as illustrated in FIG. 14L. Back end of line processing is performed in step 1326 to electrically couple the LDMOS transistor and the CMOS transistor to additional circuitry. In one example of step 1326, body electrode 210, source electrode 212, first gate electrode 214, and drain electrode 216 are formed and are electrically coupled to additional circuitry on silicon wafer 1406, and CMOS transistor 1402 is electrically coupled to additional circuitry on silicon wafer 1406.

Steps 1302, 1304, 1316, 1320, 1324, and 1326 are both CMOS and LDMOS processing steps. Steps 1306-1314, 1318, and 1322 are solely LDMOS processing steps. The CMOS thermal budget is advantageously not materially affected by RESURF formation step 1306, and method 1300 can be adapted to form both RESURF and non-RESURF devices. Method 1300 could also be modified to form additional LDMOS transistors and/or CMOS transistors, as well to form one or more other LDMOS transistors disclosed herein in addition to, or in place, of LDMOS transistor 200.

Combinations of Features

Features described above as well as those claimed below may be combined in various ways without departing from the scope hereof. The following examples illustrate some possible combinations:

(A1) A lateral double-diffused metal-oxide-semiconductor field effect (LDMOS) transistor may include a silicon semiconductor structure, including: (1) a base layer, (2) a p-type reduced surface field effect (RESURF) layer disposed over the base layer in a thickness direction, (3) a p-body disposed over the p-type RESURF layer in the thickness direction, (4) a source p+ region and a source n+ region each disposed in the p-body, (5) a high-voltage n-type laterally-diffused drain (HVNLDD) disposed adjacent to the p-body in a lateral direction orthogonal to the thickness direction, the HVNLDD contacting the p-type RESURF layer, and (6) a drain n+ region disposed in the HVNLDD. The LDMOS transistor may further include (1) a first dielectric layer disposed on the silicon semiconductor structure in the thickness direction over at least part of the p-body and the HVNLDD and (2) a first gate conductor disposed on the first dielectric layer in the thickness direction.

(A2) In the LDMOS transistor denoted as (A1), the source p+ region may have a greater p-type dopant concentration than the p-body, the p-body may have a greater p-type dopant concentration than the p-type RESURF layer, and each of the source n+ region and the drain n+ region may have a greater n-type dopant concentration than the HVN-LDD.

(A3) In any of the LDMOS transistors denoted as (A1) and (A2), the base layer may be selected from the group consisting of an n-type high-voltage well in a silicon substrate and a p-type silicon substrate.

(A4) In any of the LDMOS transistors denoted as (A1) through (A3), the source p+ region may be adjacent to the source n+ region in the lateral direction.

(A5) In any of the LDMOS transistors denoted as (A1) through (A3), a low-voltage n-type laterally diffused drain (LVNLDD) may be disposed over at least a portion of the p-body, each of the source p+ region and the source n+ region may extend at least partially into the LVNLDD, and the source p+ region may be adjacent to the source n+ region in a depth direction orthogonal to each of the thickness and lateral directions.

(A6) In any of the LDMOS transistors denoted as (A1) through (A5), the first dielectric layer may be formed of silicon dioxide or a high-K dielectric material, and the first gate conductor may be formed of polysilicon.

(A7) In any of the LDMOS transistors denoted as (A1) through (A6), the HVNLDD may have length in the lateral direction, and the p-type RESURF layer may extend along the entire length of the HVNLDD.

(A8) In any of the LDMOS transistors denoted as (A1) through (A7), the HVNLDD may be separated from the p-body in the lateral direction.

(A9) Any of the LDMOS transistors denoted as (A1) through (A8) may further include (1) a body electrode contacting the source p+ region, (2) a source electrode contacting the source n+ region, (3) a first gate electrode contacting the first gate conductor, and (4) a drain electrode contacting the drain n+ region.

(A10) In any of the LDMOS transistors denoted as (A1) through (A9), the silicon semiconductor structure may further include an n-type RESURF layer disposed adjacent to the first dielectric layer in the thickness direction, where the n-type RESURF layer has a different n-type dopant concentration than the HVNLDD.

(A11) Any of the LDMOS transistors denoted as (A1) through (A9) may further include a second dielectric layer formed on the silicon semiconductor structure in the thickness direction over the HVNLDD.

(A12) In the LDMOS transistor denoted as (A11), the first gate conductor may be disposed on each of the first and second dielectric layers in the thickness direction.

(A13) The LDMOS transistor denoted as (A11) may further include a second gate conductor disposed on the second dielectric layer in the thickness direction, where the second gate conductor is spatially separated from the first gate conductor in the lateral direction.

(A14) The LDMOS transistor denoted as (A13) may further include a shallow-trench isolation layer disposed in a trench in the silicon semiconductor structure under the second gate dielectric layer in the thickness direction.

(A15) Any of the LDMOS transistors denoted as (A13) and (A14) may further include a second gate electrode contacting the second gate conductor.

(A16) In any of the LDMOS transistors denoted as (A11) through (A15), the silicon semiconductor structure may further include an n-type RESURF layer disposed adjacent to each of the first and second dielectric layers in the thickness direction, where the n-type RESURF layer has a different n-type dopant concentration than the HVNLDD.

(B1) A switching circuit may include: (1) the LDMOS transistor denoted as (A15), (2) driver circuitry configured to repeatedly drive the first gate electrode between at least two different voltage magnitudes relative to the source electrode, and (3) bias circuitry configured to maintain the second gate electrode at a positive voltage relative to the source electrode.

(B2) In the switching circuit denoted as (B1), the body electrode may be electrically coupled to the source electrode.

(C3) A switching circuit may include: (1) the LDMOS transistor denoted as (A9) and (2) driver circuitry configured to repeatedly drive the first gate conductor between at least two different voltage magnitudes relative to the source electrode, where the body electrode is electrically coupled to the source electrode.

(D1) A method for forming an integrated circuit including a lateral double-diffused metal-oxide-semiconductor field effect (LDMOS) transistor and a complementary metal-oxide-semiconductor (CMOS) transistor may include: (1) forming one or more shallow trenches in a silicon wafer to at least partially delineate the LDMOS transistor from the CMOS transistor, (2) forming a LDMOS transistor impurity well and a CMOS transistor impurity well in the silicon wafer, (3) forming a p-type reduced surface field effect (RESURF) layer in the LDMOS transistor impurity well, (4) forming a high-voltage n-type laterally-diffused drain (HVNLDD) in the LDMOS transistor impurity well, (5) forming and etching a high-voltage dielectric layer on a first outer surface of the silicon wafer, (6) forming a low-voltage dielectric layer on the first outer surface of the silicon wafer, (7) disposing a polysilicon layer over the first outer surface of the silicon wafer, (8) etching the polysilicon layer in a source region of the LDMOS transistor, (9) forming a p-body in the LDMOS transistor impurity well, (10) etching the polysilicon layer and the low-voltage dielectric layer to form a gate structure of the CMOS transistor, (11) etching the high-voltage dielectric layer in the drain region of the LDMOS transistor, (12) forming a drain region and a source region of each of the LDMOS transistor and the CMOS transistor, and (13) performing back end of line processing to electrically couple the LDMOS transistor and the CMOS transistor to additional circuitry of the silicon wafer.

Changes may be made in the above devices, methods, and systems without departing from the scope hereof. For example, the n-channel LDMOS transistors discussed above could be modified to be p-channel LDMOS transistors. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claim is:

1. A lateral double-diffused metal-oxide-semiconductor field effect (LDMOS) transistor, comprising:
a silicon semiconductor structure, including:
a base layer,
a p-type reduced surface field effect (RESURF) layer disposed over the base layer in a thickness direction,
a p-body disposed over the p-type RESURF layer in the thickness direction,
a source p+ region and a source n+ region each disposed in the p-body,
a high-voltage n-type laterally-diffused drain (HVNLDD) disposed adjacent to the p-body in a lateral direction orthogonal to the thickness direction, the HVNLDD contacting the p-type RESURF layer, and a drain n+ region disposed in the HVNLDD;

a first dielectric layer disposed on the silicon semiconductor structure in the thickness direction over at least part of the p-body and the HVNLDD; and a first gate conductor disposed on the first dielectric layer in the thickness direction;

wherein the silicon semiconductor structure further includes an n-type reduced surface field effect (RESURF) layer disposed adjacent to the first dielectric layer in the thickness direction, the n-type RESURF layer having a different n-type dopant concentration than the HVNLDD.

2. The LDMOS transistor of claim 1, the source p+ region having a greater p-type dopant concentration than the p-body, the p-body having a greater p-type dopant concentration than the p-type RESURF layer, and each of the source n+ region and the drain n+ region having a greater n-type dopant concentration than the HVNLDD.

3. The LDMOS transistor of claim 1, the base layer being selected from the group consisting of an n-type high-voltage well in a silicon substrate and a p-type silicon substrate.

4. The LDMOS transistor of claim 1, the source p+ region being adjacent to the source n+ region in the lateral direction.

5. The LDMOS transistor of claim 1, the first dielectric layer being formed of silicon dioxide or a high-K dielectric material, and the first gate conductor being formed of polysilicon.

6. The LDMOS transistor of claim 1, the HVNLDD having a length in the lateral direction, the p-type RESURF layer extending along the entire length of the HVNLDD.

7. The LDMOS transistor of claim 1, the HVNLDD being separated from the p-body in the lateral direction.

8. The LDMOS transistor of claim 1, further comprising:
a body electrode contacting the source p+ region;
a source electrode contacting the source n+ region;
a first gate electrode contacting the first gate conductor; and
a drain electrode contacting the drain n+ region.

9. A switching circuit, comprising:
the LDMOS transistor of claim 8; and
driver circuitry configured to repeatedly drive the first gate conductor between at least two different voltage magnitudes relative to the source electrode,
the body electrode being electrically coupled to the source electrode.

10. A lateral double-diffused metal-oxide-semiconductor field effect (LDMOS) transistor, comprising:
a silicon semiconductor structure, including:
a base layer,
a p-type reduced surface field effect (RESURF) layer disposed over the base layer in a thickness direction,
a p-body disposed over the p-type RESURF layer in the thickness direction,
a source p+ region and a source n+ region each disposed in the p-body,
a high-voltage n-type laterally-diffused drain (HVNLDD) disposed adjacent to the p-body in a lateral direction orthogonal to the thickness direction, the HVNLDD contacting the p-type RESURF layer, and
a drain n+ region disposed in the HVNLDD;
a first dielectric layer disposed on the silicon semiconductor structure in the thickness direction over at least part of the p-body and the HVNLDD;

a first gate conductor disposed on the first dielectric layer in the thickness direction;

a second dielectric layer formed on the silicon semiconductor structure in the thickness direction over the HVNLDD; and a second gate conductor disposed on the second dielectric layer in the thickness direction, the second gate conductor being spatially separated from the first gate conductor in the lateral direction.

11. The LDMOS transistor of claim 10, further comprising a shallow-trench isolation layer disposed in a trench in the silicon semiconductor structure under the second gate dielectric layer in the thickness direction.

12. The LDMOS transistor of claim 10, further comprising:
a body electrode contacting the source p+ region;
a source electrode contacting the source n+ region;
a first gate electrode contacting the first gate conductor;
a second gate electrode contacting the second gate conductor; and
a drain electrode contacting the drain n+ region.

13. The LDMOS transistor of claim 10, the silicon semiconductor structure further comprising an n-type reduced surface field effect (RESURF) layer disposed adjacent to each of the first and second dielectric layers in the thickness direction, the n-type RESURF layer having a different n-type dopant concentration than the HVNLDD.

14. A switching circuit, comprising:
the LDMOS transistor of claim 12;
driver circuitry configured to repeatedly drive the first gate electrode between at least two different voltage magnitudes relative to the source electrode; and
bias circuitry configured to maintain the second gate electrode at a positive voltage relative to the source electrode.

15. The switching circuit of claim 14, the body electrode being electrically coupled to the source electrode.

16. The LDMOS transistor of claim 10, the first gate conductor being disposed on each of the first and second dielectric layers in the thickness direction.

17. A lateral double-diffused metal-oxide-semiconductor field effect (LDMOS) transistor, comprising:
a silicon semiconductor structure, including:
a base layer,
a p-type reduced surface field effect (RESURF) layer disposed over the base layer in a thickness direction,
a p-body disposed over the p-type RESURF layer in the thickness direction,
a source p+ region and a source n+ region each disposed in the p-body,
a high-voltage n-type laterally-diffused drain (HVNLDD) disposed adjacent to the p-body in a lateral direction orthogonal to the thickness direction, the HVNLDD contacting the p-type RESURF layer, and
a drain n+ region disposed in the HVNLDD;
a first dielectric layer disposed on the silicon semiconductor structure in the thickness direction over at least part of the p-body and the HVNLDD;
a first gate conductor disposed on the first dielectric layer in the thickness direction; and
a low-voltage n-type laterally diffused drain (LVNLDD) disposed over at least a portion of the p-body, each of the source p+ region and the source n+ region extending at least partially into the LVNLDD;

the source p+ region being adjacent to the source n+ region in a depth direction orthogonal to each of the thickness and lateral directions.

\* \* \* \* \*

UNITED STATES PATENT AND TRADEMARK OFFICE
CERTIFICATE OF CORRECTION

PATENT NO.       : 10,229,993 B2
APPLICATION NO.  : 15/456930
DATED            : March 12, 2019
INVENTOR(S)      : John Xia et al.

Page 1 of 1

It is certified that error appears in the above-identified patent and that said Letters Patent is hereby corrected as shown below:

On the Title Page

Item (73):
"(73) Assignee: Maxin Integrated Products, Inc., San Jose, CA (US)"

Should read:
-- (73) Assignee: Maxim Integrated Products, Inc., San Jose, CA (US) --

Signed and Sealed this
Sixteenth Day of April, 2019

Andrei Iancu
*Director of the United States Patent and Trademark Office*